(12) United States Patent
Kato et al.

(10) Patent No.: US 7,142,468 B2
(45) Date of Patent: Nov. 28, 2006

(54) CONTROL METHOD OF SEMICONDUCTOR MEMORY DEVICE AND SEMICONDUCTOR MEMORY DEVICE

(75) Inventors: Yoshiharu Kato, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 554 days.

(21) Appl. No.: 10/299,713

(22) Filed: Nov. 20, 2002

(65) Prior Publication Data

US 2003/0191974 A1     Oct. 9, 2003

(30) Foreign Application Priority Data

Apr. 9, 2002   (JP) .............................. 2002-106344

(51) Int. Cl.
*G11C 7/00* (2006.01)
*G11C 8/00* (2006.01)

(52) U.S. Cl. ................. 365/194; 365/230.06; 365/239; 365/204; 365/203

(58) Field of Classification Search ................ 365/194, 365/195, 203, 204, 230.04, 230.09, 235, 365/238.5, 239, 233, 230.06; 711/218
See application file for complete search history.

(56) References Cited

U.S. PATENT DOCUMENTS 5,668,774 A * 9/1997 Furutani ..................... 365/233
5,729,504 A * 3/1998 Cowles ....................... 365/236
6,026,034 A * 2/2000 Suzuki et al. ............... 365/190
6,229,758 B1 * 5/2001 Agata ......................... 365/233
6,442,088 B1 * 8/2002 Tsuchida et al. ............ 365/203

FOREIGN PATENT DOCUMENTS

| JP | 06-176568 | 6/1994 |
| JP | 09-161477 | 6/1997 |
| JP | 10-312684 | 11/1998 |
| JP | 2001-236798 | 8/2001 |

* cited by examiner

*Primary Examiner*—J. H. Hur
(74) *Attorney, Agent, or Firm*—Arent Fox PLLC

(57) ABSTRACT

It is intended to provide a control method of a semiconductor memory device and a semiconductor memory device capable of shortening pre-charge operation time that comes after termination of successive data access operation, namely, successive data read/write operation, without causing deterioration of restore voltage to memory cells and delay of initial data access time. An activated word line WL0 is deactivated with appropriate timing that is between time after bit line pairs (BL0 and /BL0, . . . BLN and /BLN) are differentially amplified up to full amplitude voltage level and time where column selecting lines CL0, . . . CLN are selected. That is, deactivation time $\tau A$ for the word line can be embedded in a period of successive data access operation. Pre-charge operation can be terminated within time that is a sum of deactivation time $\tau B$ of a sense amplifier and equalizing time $\tau C$ of the bit line pairs. Thereby, pre-charge period can be shortened.

25 Claims, 15 Drawing Sheets

DIAGRAM FOR ILLUSTRATING PRINCIPLE OF PRESENT INVENTION

FIG. 1 DIAGRAM FOR ILLUSTRATING PRINCIPLE OF PRESENT INVENTION

FIG. 2 CIRCUIT BLOCK DIAGRAM SHOWING DATA-INPUT/OUTPUT PATH DIRECTED TO FIRST EMBODIMENT

FIG. 3 SPECIFIC EXAMPLE OF PRE-CHARGE CONTROL SECTION DIRECTED TO FIRST EMBODIMENT

OPERATIONAL WAVEFORM DIAGRAM DIRECTED TO FIRST EMBODIMENT

FIG. 5 PRE-CHARGE CONTROL SECTION DIRECTED TO SECOND EMBODIMENT

FIG. 7  SPECIFIC EXAMPLE OF BIT-LINE-VOLTAGE MONITORING CIRCUIT DIRECTED TO THIRD EMBODIMENT

FIG. 8 PAGE OPERATION (NORMAL OPERATION) OF ASYNCHRONOUS-TYPE MEMORY

PRIOR ART

FIG. 9 LATE WRITE FUNCTION (FOURTH EMBODIMENT) FOR PAGE WRITE OPERATION OF ASYNCHRONOUS-TYPE MEMORY

FIG. 10  PRIOR ART  BURST OPERATION (NORMAL OPERATION) OF SYNCHRONOUS-TYPE MEMORY

CIRCUIT BLOCK DIAGRAM SHOWING DATA-INPUT/OUTPUT PATH OF RELATED ART

OPERATIONAL WAVEFORMS OF SUCCESSIVE ACCESS OPERATION DIRECTED TO RELATED ART

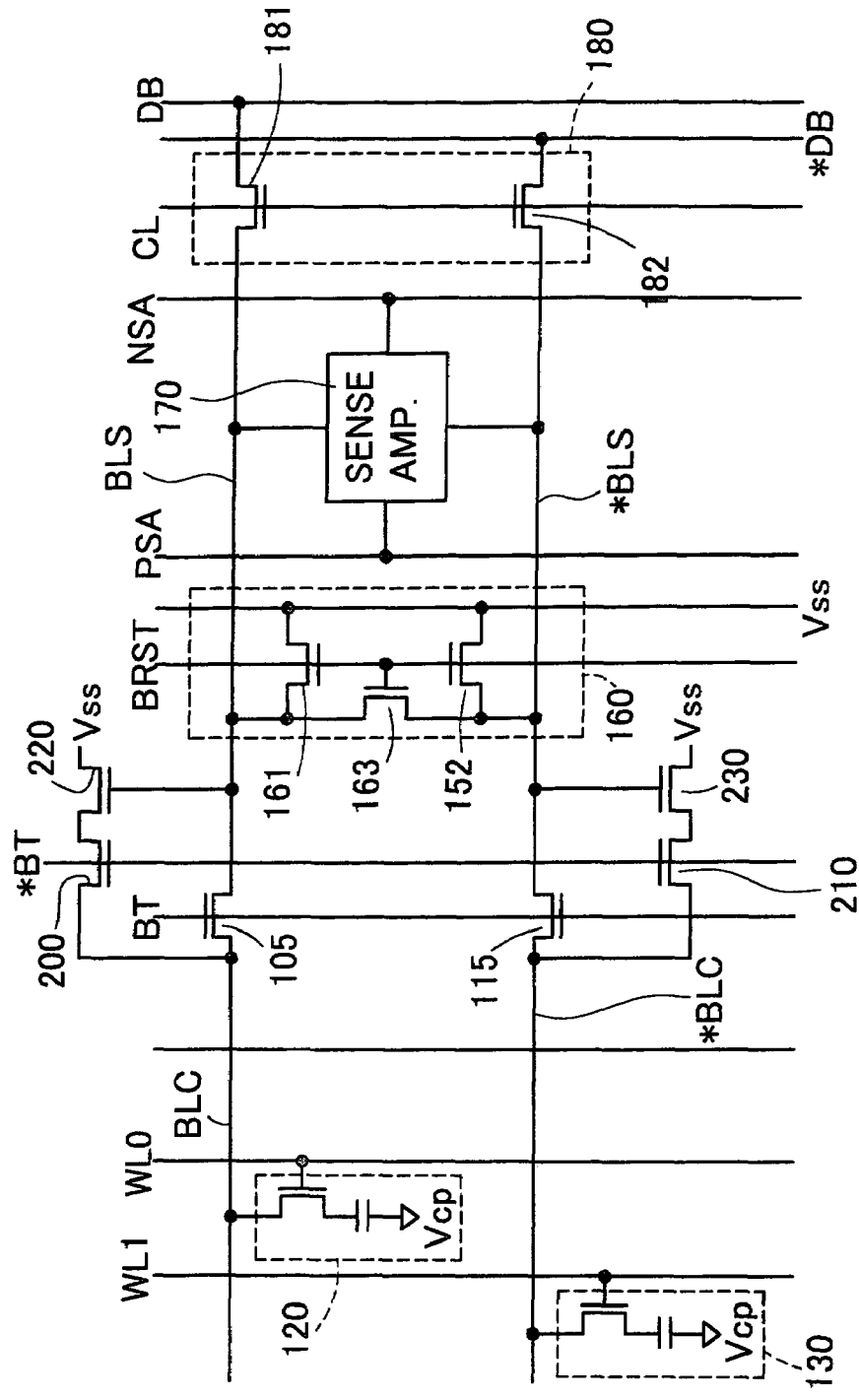
FIG. 14 CIRCUIT DIAGRAM OF DATA-INPUT/OUTPUT PATH, PRECHARGE PERIOD IN RELATED ART CUT SHORT
PRIOR ART

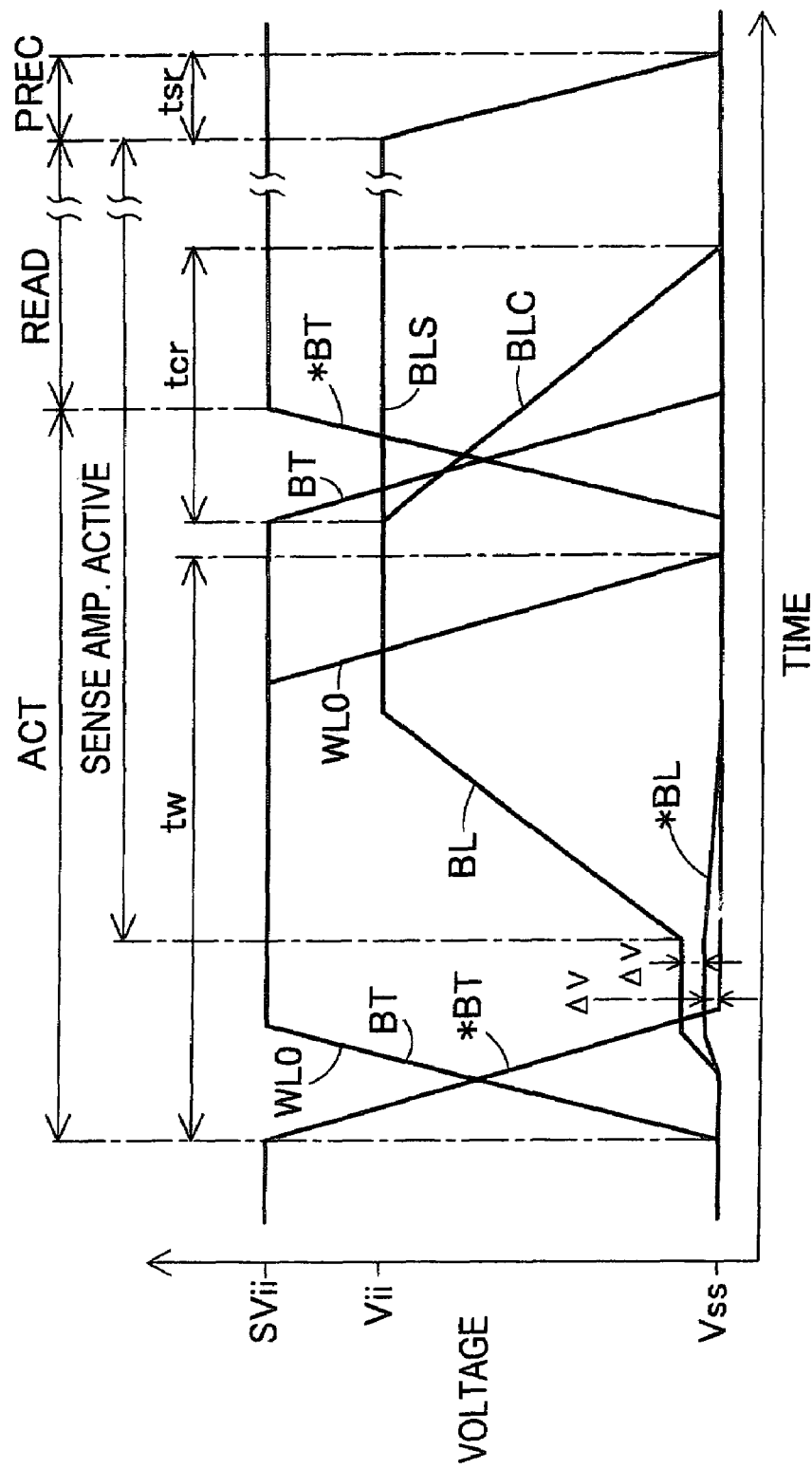
FIG. 15 PRIOR ART OPERATIONAL WAVEFORM

CONTROL METHOD OF SEMICONDUCTOR MEMORY DEVICE AND SEMICONDUCTOR MEMORY DEVICE

BACKGROUND OF THE INVENTION

1. Field of the Invention

Present invention relates to a control method of a semiconductor memory device and the semiconductor memory device having a successive data access operation, and in particular, a control method of a semiconductor memory device and the semiconductor memory device in which a pre-charge operation is required after completion of the successive access operation.

2. Description of the Related Art

Along with recent development of digital technologies, other than personal computers, digital appliances such as digital cameras, portable telephones and so on have been handling a lot of data such as image data and so on. As for retrieval and record of the image data, high-speed read-out and write of a lot of successive data is required. Consequently, a semiconductor memory device such as DRAM and so on carries out a high-speed successive access operation as follows. That is, there is used a high speed successive access operation such as a page operation, a burst operation and so on, wherein a predetermined word line is activated and data access is carried out sequentially to a memory-cell group which is selected by the word line. Here, as for the high-speed data access, it is necessary to shorten cycle time that is sum of an access operation period during the successive access operation and a pre-charge operation period at the time of completion of the successive access operation.

FIG. 12 shows a circuit block diagram of a data-input/output path in a semiconductor memory device. On the occasion of the successive data access, any one of predetermined word lines (WL0, WL1, . . . ) is activated, and data of the selected memory-cell group is differentially amplified in respective bit line pairs (BL0 and /BL0, BL1 and /BL1, . . . ). After the initiation of the differential amplification, the successive access operation is initiated. In response to column addresses, column selecting lines (CL0, CL1, . . . ) are selected sequentially. That is, corresponding transfer gates (T0Z and T0X, T1Z and T1X, . . . ) are made to be conductive sequentially and the bit line pair is connected to a data line pair (DB and /DB) so that the successive data access operation is carried out. The access operation here includes both operations of a readout operation and a write operation. Selected column addresses can be configured that they are inputted from outside sequentially and can be also configured that they are automatically set in a predetermined order.

On the occasion of completion of the successive access operation, it is necessary that, after the selected word line is deactivated so that the memory cell is separated from the bit line, each of the bit line pair (BL0 and /BL0, BL1 and /BL1, . . . ) is equalized in preparation of a next cycle. This control is carried out by a pre-charge control section 100. On the occasion of completion of the successive access operation, when a pre-charge signal PRE is inputted, a word line deactivating signal WLRSTX is outputted from a word lien deactivating circuit WLR. At the same time, a delay circuit A (DA) times deactivation time of the word line (delay time $\tau A$) and outputs a signal $\phi DA$. The signal $\phi DA$ is inputted to a sense amplifier deactivating circuit SAR and a sense amplifier deactivating signal SARSTX is outputted. Further, a delay circuit B (DB) times deactivation time of a sense amplifier (delay time $\tau B$) and outputs a signal $\phi DB$. The signal $\phi DB$ is inputted to a bit line equalizing circuit BLR and a bit line equalizing signal BLRSTX is outputted.

An appearance of the successive access operation is shown in FIG. 13. Respective bit linepairs (BL0 and /BL0, BL1 and/BL1, . . . ) are differentially amplified and in contrast, the data line pair (DB and /DB) is amplitude-limited in voltage. Since ($\frac{1}{2}$) VCC voltage is set as a central value, on the occasion of connection by column selecting lines (CL0, CCL1, . . . ), disturb phenomenon occurs in the bit line. That is, an electric potential moves from the data line to the bit line of low voltage level so that the voltage level is increased, and an electric potential moves from the bit line of high voltage level to the data line so that the voltage level is decreased. This situation is restored by the sense amplifier after the separation of the data line.

The pre-charge period is classified into three time regions of the word line deactivation time $\tau A$ for separating the memory cell from the bit line, the sense amplifier deactivation time $\tau B$ and bit line pair equalizing time $\tau C$.

Japanese Laid-open Patent Publication No.10-312684 discloses a countermeasure as for shortening of the pre-charge period. FIG. 14 shows a circuit block diagram and FIG. 15 shows operational waveforms at the time of data read-out.

In the circuit block described in the Japanese Laid-open Patent Publication No.10-312684 shown in FIG. 14, a first cell side bit line BLC is connected to one end of a first transfer gate 105, and a first sense amplifier side bit line BLS is connected to the other end of the first transfer gate 105, and a second cell side bit line *BLC is connected to one end of a second transfer gate 115 and a second sense amplifier side bit line *BLS is connected to the other end of the second transfer gate 115, and memory cells 120 and 130 that are selected by word lines WL0 and WL1 are connected to the first and second cell side bit lines BLC and *BLC, respectively, and a sense amplifier 170 is connected between the first sense amplifier side bit line BLS and the second sense amplifier side bit line *BLS.

A data read-out operation from the memory cell 120 or 130 is as shown in FIG. 15. Firstly, when the first transfer gate 105 and the second transfer gate 115 are opened, the sense amplifier 170 is activated and an electric potential difference of the first sense amplifier side bit line BLS and the second sense amplifier side bit line *BLS is amplified. After the word lines WL0 and WL1 are deactivated, the first transfer gate 105 and the second transfer gate 115 are closed. At this time, the first memory cell side bit line BLC and the second memory cell side bit line *BLC are set to be of bit line reset potential VSS, and in parallel to this, signals on the first and second sense amplifier side bit lines BLS and *BLS are outputted.

Hereby, in case of data read-out, in advance of signal outputting from the first and second sense amplifier side bit lines BLS and *BLS, deactivation of the word lines WL0 and WL1 is already carried out. Therefore, during the pre-charge period, it is not necessary to carry out the deactivating operation of the word lines WL0 and WL1.

However, the semiconductor memory device of FIG. 12 needs a good deal of time as to the deactivating operation of the word lines which are carried out during the pre-charge period and the equalizing operation of the bit line pairs, which is a problem. This is because a lot of the memory cells are connected to both the word lines and the bit lines and length of wiring is very long. That is, it is because parasitic capacity due to the memory cells and wire resistance due to the wiring become a great deal and large time constant is required for voltage transition.

Based upon future trend of larger memory capacity design, the number of memory cells which are connected to the word lines and the bit lines is increased, and based upon this, there is a trend that wire length is lengthened. Further, it is expected that time constant in voltage transition of the word lines and the bit lines is lengthened more and more. There is a possibility that, as for the shortened access period by the high-speed successive access operation, shortening of the pre-charge-period becomes insufficient and increase of cycle time is invited. There is a possibility that, because of the increase of cycle time, data access speed is limited. Further, there is a possibility that the proportion of the pre-charge period in the cycle time is relatively increased and thereby, rate of data access cannot be raised. There is a possibility that high speed and high efficiency data access request cannot be satisfied, which is a problem.

In Japanese Laid-open Patent Publication No.10-312684, deactivation of the word lines is carried out in advance of signal outputting from the bit line pair BLS and *BLS. Hereby, there occurs no necessity that the deactivation of the word lines is carried out during the pre-charge period, and it is possible to try to shorten the pre-charge period. However, in this case, the signal outputting from the bit line pair BLS and *BLS is carried out after the deactivation of the word lines, which is a problem.

That is, after the differential amplification of the bit line pair BLC and *BLC is completed and data is restored in the memory cell, it is necessary to carry out the deactivation of the word lines. Therefore, under normal circumstances, initiation of the read-out operation of first data that can be read out before the differential amplification of the bit line pair is completed is delayed. There is a possibility that high speed data access request cannot be satisfied, which is a problem.

Further, Japanese Laid-open Patent Publication No.10-312684 is of such content that, in advance of the read-out operation, the deactivation of the word lines is carried out and thereby, the deactivation of the word lines during the pre-charge period is eliminated. Since the word lines are deactivated in advance, it cannot apply to a write operation and there is a possibility that it cannot apply to the shortening of the pre-charge period after the write operation, which is a problem.

SUMMARY OF THE INVENTION

Accordingly, it is an object of the present invention to provide a control method of a semiconductor memory device and a semiconductor memory device capable of shortening pre-charge operation time that comes after termination of successive data access operation, namely, successive data read/write operation, without causing deterioration of restore voltage to memory cells and delay of initial data access time.

To achieve the object, according to one aspect of the present invention, there is provided a control method of a semiconductor memory device for executing successive access operation, the control method comprising: data amplification step where a word line is activated and a plurality of memory cells are connected to a plurality of bit lines to amplify data; and column selection step where a column connects at least one bit line out of the plurality of the bit lines and at least one data line in order after the data amplification step; word line deactivation step where a word line is deactivated in a period that satisfies following two conditions (1) and (2): (1) a period after predetermined timing taken after the data amplification at the plurality of bit lines completes; and (2) non-column selection period between completion of an anterior first column selection and start of a posterior second column selection.

Furthermore, according to another aspect of the present invention, there is provided a control method of a semiconductor memory device comprising: word line activation step where a word line is activated in accordance with start request of successive access operation so as to connect a plurality of memory cells to a plurality of bit lines, respectively; data-amplification step where a plurality of data read out to the plurality of bit lines from the plurality of memory cells are amplified; data-access-start step where the successive access operation is started by conducting column selection for connecting at least any one of the plurality of bit lines to at least one data line after amplification level in the data-amplification step reaches predetermined level; word line deactivation step where the word line is deactivated after the amplification operation in the data-amplification step is completed and while the column selection in the data-access-start step is deactivated; data-access-keep step where the column selection is conducted in order with respect to any one of the plurality of bit lines so as to keep the successive access operation after the word line deactivation step; and pre-charge step for initializing the plurality of bit lines by stopping data amplification operation in accordance with termination request of the successive access operation.

Still further, there is provided a semiconductor memory device, directed to the one aspect of the present invention, comprising a plurality of bit lines each of which is connected to each of a plurality of memory cells when a word line is activated; a plurality of column selecting sections where each of the plurality of bit lines is individually selected; and at least one data line to be connected to at least any one of the plurality of bit lines through at least any one of the plurality of column selecting sections; the semiconductor memory device conducting successive access operation by selecting at least any one of the plurality of column selecting sections in order, wherein the semiconductor memory device further comprises: a first-column-selection-termination detector circuit that detects termination of selecting a first column selecting section to be selected in advance; a timing informer section that informs a period that is after completion of data amplification and from termination of selecting the first column selecting section to be selected in advance until start of selecting a second column selecting section to be selected after selection of the first column selecting section; and a word line deactivating circuit that becomes active when none of the plurality of column selecting sections operates is selected in accordance with an informing signal from the timing informer section.

In the semiconductor memory device directed to the one aspect of the present invention, the timing informer section informs period that is after completion of data amplification at the plurality of bit lines and time from termination of an anterior column selection until start of a posterior column selection by the second column selecting section, as column selection anterior to selection of the first column selecting section detected by the first-column-selection-termination detector circuit. By an informing signal, the word line deactivating circuit is activated and the word line is deactivated consequently when column selection is not carried out.

Thereby, in the semiconductor memory device, it is possible to carry out the deactivation of the word line during ongoing successive access operation. Therefore, it is not necessary to carry out the same during the pre-charge period that is an initialization operation period that comes after completion of the successive access operation. Even though the word line is connected to the plurality of memory cells and wiring length is lengthened and time constant of voltage transition is increased on the occasion of the deactivation along with increase of capacity of the semiconductor memory device, the time constant is not added to the pre-charge period, whereby the pre-charge period can be shortened. Accordingly, there can be reduced rate of the pre-charge period occupying successive access operation period for access to the memory cells can be compressed. Thereby, it is possible to shorten cycle time and improve ratio if data access operation occupying the entirety of operation period.

Further, the deactivation operation of the word line is carried out during a period where column selection is not carried out under ongoing successive access operation or under a situation that the word line deactivating circuit is activated without the column selecting section being selected. Accordingly, the deactivating operation of the word line can be carried out during at a time point that column selection is completed and data-restore to the memory cells is completed, avoiding a period that the plurality of bit lines receive the disturb phenomenon during column selection. Thereby, the pre-charge period can be shortened without aggravating retention of data that is stored in the plurality of memory cells.

Further, in an activated situation before the word line is deactivated, data access is initiated at a stage that the plurality of bit lines are amplified to voltage level in which logical level of data is not reversed even in case of the disturb phenomenon. Accordingly, as an initial data access speed in the successive access operation is maintained in high speed, the deactivating operation of the word line is carried out during ongoing successive access operation. Thereby, the pre-charge period can be shortened.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 14 is circuit diagram of a data-input/output path wherein pre-charge period in related art is cut short; and FIG. 15 is an operational waveform diagram of FIG. 14.

DETAILED DESCRIPTION OF THE PREFERRED EMBODIMENTS

Figure 1:
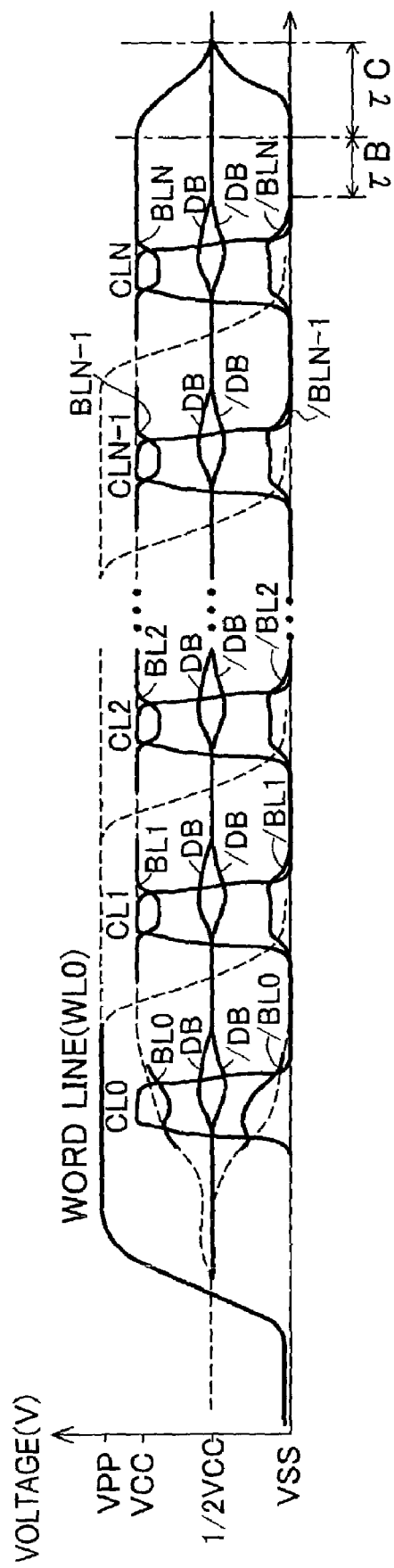
FIG. 1 is an operational waveform diagram of successive access operation for illustrating principle of the present invention.

FIG. 1 shows an operational waveform diagram of successive access operation for illustrating principle of the present invention. Data of a plurality of bit lines connected to a plurality of memory cells due activation of a word line are set in a plurality of bit line pairs (BL0 and /Bl0, . . . , BLN and /BLN) and differentially amplified by sense amplifiers (not shown) up to voltage level of power source voltage VCC and ground voltage VSS. That is, when voltage level of the plurality of bit lines connected to the plurality of memory cells reach the power source voltage VCC or the ground voltage VSS, data-restore to each of the memory cells terminates and retention of data can be kept.

When voltage level obtained by differential amplification at the bit line pairs (BL0 and /Bl0, . . . , BLN and /BLN) reaches predetermined voltage level, connection between a bit line pair selected by column selecting lines CL0, . . . , CLN and a data line pair (DB and /DB) is started. Voltage level of the data line pair (DB and /DB) is amplitude-limited in voltage. As a center value of amplitude-limited voltage, a voltage value is set to voltage level of (½) VCC. Therefore, when a bit line pair and a data line pair are connected, voltage level of the bit line pair receive voltage interference of the data line pair. For example, voltage level of bit lines BL0, . . . , BLN in high voltage level lowers whereas that of bit lines /BL0, . . . , /BL0 in low voltage level rises. That is, so-called disturb phenomenon occurs.

As to voltage level of the bit line pairs (BL0 and /Bl0, . . . , BLN and /BLN) when connection is started, the voltage level against voltage interference due to disturb phenomenon may be amplification level that can avoid inversion of high-low voltage relation between bit lines. Not necessarily differential amplified up to full amplification level. In FIG. 1, a column selecting line CL0 is driven in a form of pulse when differential amplification level of the bit line pair (BL0 and /BL0) reaches predetermined voltage so as to secure high-speed initial access for successive access operation.

At the time of initial access operation, the bit line pair (BL0 and /BL0) receives disturb phenomenon. However, since differential amplification of the bit line pairs (BL0 and /Bl0, . . . , BLN and /BLN) is continued even after completion of pulse drive of the column selecting line CL0, differential amplification of the bit line pair (BL0 and /BL0) is carried out accompanying recovery from the disturb phenomenon and after that, differential amplification of other bit line pairs (BL1 and /BL1, . . . , BLN and /BLN) is also carried out. Consequently, the bit line pairs are differentially amplified up to full amplitude voltage level before second time of pulse drive with respect to the column selecting line CL1.

After that, column selecting lines CL1, . . . , CLN are driven in a form of pulse in order and corresponding bit line pair (BL1 and /BL1, . . . , BLN and /BLN) and the data line pair (DB and /DB) are connected. When they are connected, disturb phenomenon occurs to the bit line pair. However, since the sense amplifier operates continuously, voltage level of the bit line pairs gets back to full voltage level after connected.

A word line WL0 currently activated is deactivated in appropriate timing taken between pulse drives of the column selecting lines CL0, . . . , CLN (in FIG. 1, transition waveform indicated with broken line with respect to the word line WL0) after the bit line pairs (BL0 and /BL0, . . . , BLN and /BLN) are differentially amplified up to full amplitude voltage level. Thereby, deactivation time $\tau A$ of the word line can be embedded in ongoing successive data access operation. Pre-charge operation can be completed only taking deactivation time $\tau B$ of the sense amplifier and equalizing time $\tau C$ of the bit line pair. Thereby, a pre-charge period can be shortened.

Hereinafter, First through Fifth Embodiments which are brought into shape as to a control method of a semiconductor memory device and the semiconductor memory device of the invention will be concretely described with reference to the drawings based upon FIGS. 2 through 11.

Figure 2:
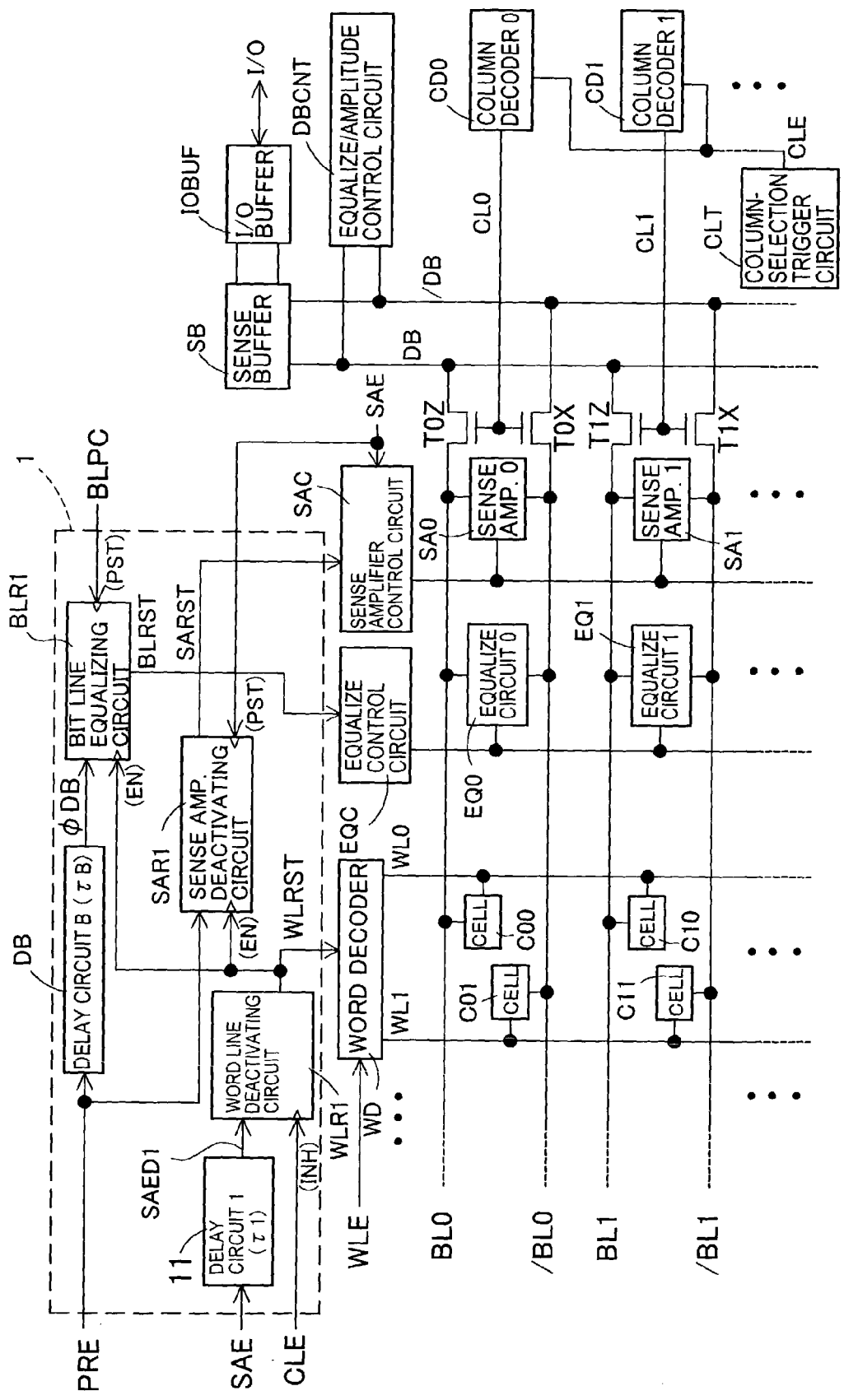
FIG. 2 is a circuit block diagram showing data-input/output path of a semiconductor memory device directed to a first embodiment.

FIG. 2 is a circuit block diagram as to a data-input/output path of the semiconductor memory device of a First Embodiment. Memory cells C00 and C10 selected by a word line WL0 are connected to bit lines BL0 and BL1, respectively, and memory cells C01 and C11 selected by a word line WL1 are connected to bit lines /BL0 and /BL1, respectively. The word lines WL0 and WL1 are selected by decoding a row address (not shown) by a word decoder WD that is activated by a word line activating signal WLE.

Data read out to the bit lines BL0 and BL1, /BL0 and /BL1 are differentially amplified by a sense amplifier 0 (SA0) and a sense amplifier 1 (SA1) as bit line pairs BL0 and /BL0, BL1 and /BL1. The sense amplifiers 0 and 1 (SA0, SA1) are controlled by a sense amplifier activating signal SAE through a sense amplifier control circuit SAC.

The bit line pairs (BL0 and /BL0, BL1 and /BL1) are controlled by column selecting lines CL0 and CL1 and electrically connected to data line pair (DB and /DB) through transfer gate pairs (T0Z and T0X, T1Z and T1X) so that a data access operation is carried out.

The column selecting lines CL0 and CL1 are outputted from a column decoder 0 (CD0) or a column decoder 1 (CD1) that corresponds to a decoded column address (not shown), by a column-selection trigger signal CLE from a column-selection trigger circuit CLT.

Data read out to the data line pair (DB and /DB) is amplified by a sense buffer SB and outputted from an input/output buffer IOBUF. Further, write data that is inputted to the input/output buffer IOBUF is written in the bit line pair (BL0 and /BL0) or (BL1 and /BL1) from a not-shown write amplifier through the data line pair (DB and /DB).

It is an equalize circuit 0 (EQ0) and an equalize circuit 1 (EQ1) that equalize the bit line pairs (BL0 and /BL0, BL1 and /BL1) for initialization of the bit line pairs at the time of completion of data access. An equalizing operation is carried out under control of an equalize control circuit EQC.

A pre-charge control section 1 in the First Embodiment has a word line deactivating circuit WLR1 for deactivating the word lines, a sense amplifier deactivating circuit SAR1 for deactivating the sense amplifiers, and a bit line equalizing circuit BLR1 for equalizing the bit line pairs.

To the word line deactivating circuit WLR1, a delay circuit 1 (11) to which the sense amplifier activating signal SAE is inputted is connected and a delay signal SAED1 in which delay time $\tau 1$ is added to the sense amplifier activating signal SAE is inputted as a control signal. Further, the column-selection trigger signal CLE is inputted to an inhibition (INH) terminal. From the word line deactivating circuit WLR1, the word line deactivating signal WLRST is outputted and further inputted to a word decoder WD and inputted to enable (EN) terminals of the sense amplifier deactivating circuit SAR1 and the bit line equalizing circuit BLR1.

The sense amplifier deactivating circuit SAR1 is controlled by the pre-charge signal PRE and the sense amplifier deactivating signal SARST is outputted to the sense amplifier control circuit SAC. Further, to a preset (PST) terminal of the sense amplifier deactivating circuit SAR1, the sense amplifier activating signal SAE is inputted.

To the bit line equalizing circuit BLR1, the delay circuit B (DB) to which the pre-charge signal PRE is inputted is connected and the delay signal $\phi$DB in which the delay time $\tau B$ is added to the pre-charge signal PRE is inputted, and the bit line equalizing signal BLRST is outputted to the equalize control circuit EQC. Further, to the preset (PST) terminal of the bit line equalize circuit BLR1, a bit-line-equalizing cancel signal BLPC is inputted.

When the pre-charge period is completed and the successive data access operation is initiated, the bit-line-equalizing cancel signal BLPC is outputted and the bit line equalizing circuit BLR1 is preset. The bit line equalizing signal BLRST is deactivated and it changes to a situation in which the enable (EN) terminal can accept the word line deactivating signal WLRST and the delay signal $\phi$DB.

After the word line WL0 or WL1 is selected by the word line activating signal WLE, the sense amplifier activating signal SAE is activated and differential amplification of the bit line pairs (BL0 and /BL0, BL1 and /BL1) is initiated. At the same time, the sense amplifier deactivating circuit SAR1 is preset and the sense amplifier deactivating signal SARST is deactivated, and it changes to a situation in which the enable (EN) terminal can accept the word line deactivating signal WLRST and the pre-charge signal PRE. Further, it is inputted to the delay circuit 1 (11) and timing length of the delay signal SAED1 having the delay time $\tau 1$ is initiated.

Here, the delay time $\tau 1$ is of time from the input of the sense amplifier activating signal SAE until predetermined timing after the completion of the differential amplification of the bit line pairs (BL0 and /BL0, BL1 and /BL1). This time is set to be a period in which pulse driving is not carried out as the deactivating period of the column-selection trigger signal CLE in the successive access operation. However, in preparation of difference of pulse driving timing of the column-selection trigger signal CLE and critical operational timing between the column-selection trigger signal CLE and the word line deactivating signal WLRST on the occasion of speeding up, the column-selection trigger signal CLE is set to be the inhibition (INH) signal. In case that the delay signal SAED1 is inputted before the completion of pulse driving of the column-selection trigger signal CLE, the word line deactivating signal WLRST is outputted in wait for the completion of the pulse driving of the column-selection trigger signal CLE.

When the delay time $\tau 1$ is timed from input of the sense amplifier activating signal SAE, the delay signal SAED1 is outputted to the word line deactivating circuit WLR1. In the word line deactivating circuit WLR1, the column-selection trigger signal CLE is inputted to the inhibition (INH) terminal and therefore, the column-selection trigger signal CLE is not activated, and under a situation that the column selecting lines CL0 and CL1 are not pulse-driven, based upon the input of the delay signal SAED1, the word line deactivating signal WLRST is outputted. Hereby, the word line WL0 or WL1 is deactivated before the initiation of the pre-charge period.

In this case, it is preferable that the word line deactivating signal WLRST is a latch signal or a situation is latched after the signal is inputted to the enable (EN) terminals of the sense amplifier deactivating circuit SAR1 and the bit line equalizing circuit BLR1. Further, in case that the word line deactivating signal WLRST is not the latch signal, it is preferable that the situation is latched also in the word decoder WD.

When the deactivating situation of the word line is latched, the sense amplifier deactivating circuit SAR1 and the bit line equalizing circuit BLR1 are to be maintained in a situation in which the pre-charge signal PRE can be accepted. When the pre-charge operation is initiated after the successive access operation is completed, since the pre-charge signal PRE is directly inputted to the sense amplifier deactivating circuit SAR1, the sense amplifier deactivating signal SARST is outputted immediately and deactivation of the sense amplifier is carried out. On the other hand, since, to the bit line equalizing circuit BLR1, the pre-charge signal PRE is inputted through the delay circuit B (DB), after delay of delay time $\tau B$, the bit line equalizing signal BLRST is outputted and equalization of the bit line pairs (BL0 and /BL0, BL1 and /BL1) is initiated. Here, the delay time $\tau B$ is of time for deactivating the sense amplifier. After the sense amplifier is surely deactivated, the equalizing operation of the bit line pairs is carried out, and thereby, unnecessary go-through current between the sense amplifier and the equalize circuit is prevented.

Figure 3:
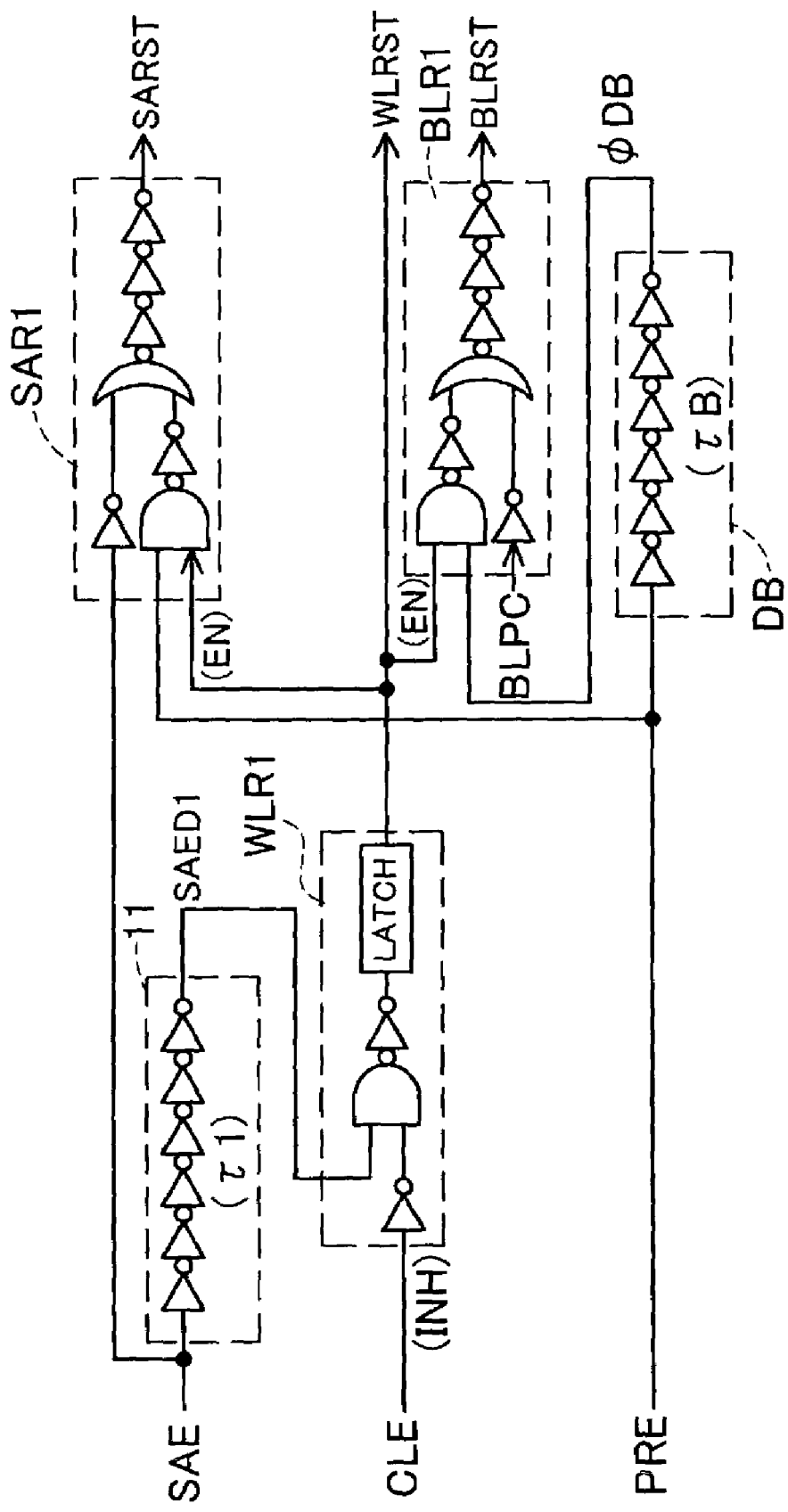
FIG. 3 shows a circuit block diagram of a specific example of pre-charge control section directed to the first embodiment.

FIG. 3 is a circuit diagram showing a specific example of the pre-charge control section 1 in First Embodiment. The delay circuit 1 (11) to which the sense amplifier activating signal SAE is inputted is constituted by even-number-stage inverter gate row and times the delay time $\tau 1$.

In the word line deactivating circuit WLR1, the delay signal SAED1 outputted from the delay circuit 1 (11) is inputted to one of input terminals of a NAND gate. To the other input terminal, the column-selection trigger signal CLE is inputted from the inhibition (INH) terminal through the inverter gate. An output terminal of the NAND gate is connected to the inverter gate and an output signal from the inverter gate is latched by the latch circuit and the word line deactivating signal WLRST is outputted.

The sense amplifier deactivating circuit SAR1 has a NOR gate and, to one of input terminals thereof, the sense amplifier activating signal SAE is inputted from the preset (PST) terminal through the inverter gate. To the other input terminal, an output terminal of the inverter gate is connected, and to this inverter gate, a NAND gate is connected. To the NAND gate, the pre-charge signal PRE and the word line deactivating signal WLRST through the enable (EN) terminal are inputted. The sense amplifier deactivating signal SARST is outputted from an output terminal of a NOR gate through three-stage serially connected inverter gates.

The bit line equalizing circuit BLR1 has the same circuit structure as the sense amplifier deactivating circuit SAR1. It is of such a structure that a bit-line-equalizing cancel signal BLPC in place of the sense amplifier activating signal SAE in the sense amplifier deactivating circuit SAR1, and a delay signal $\phi DB$ in place of the pre-charge signal PRE are inputted.

Figure 4:
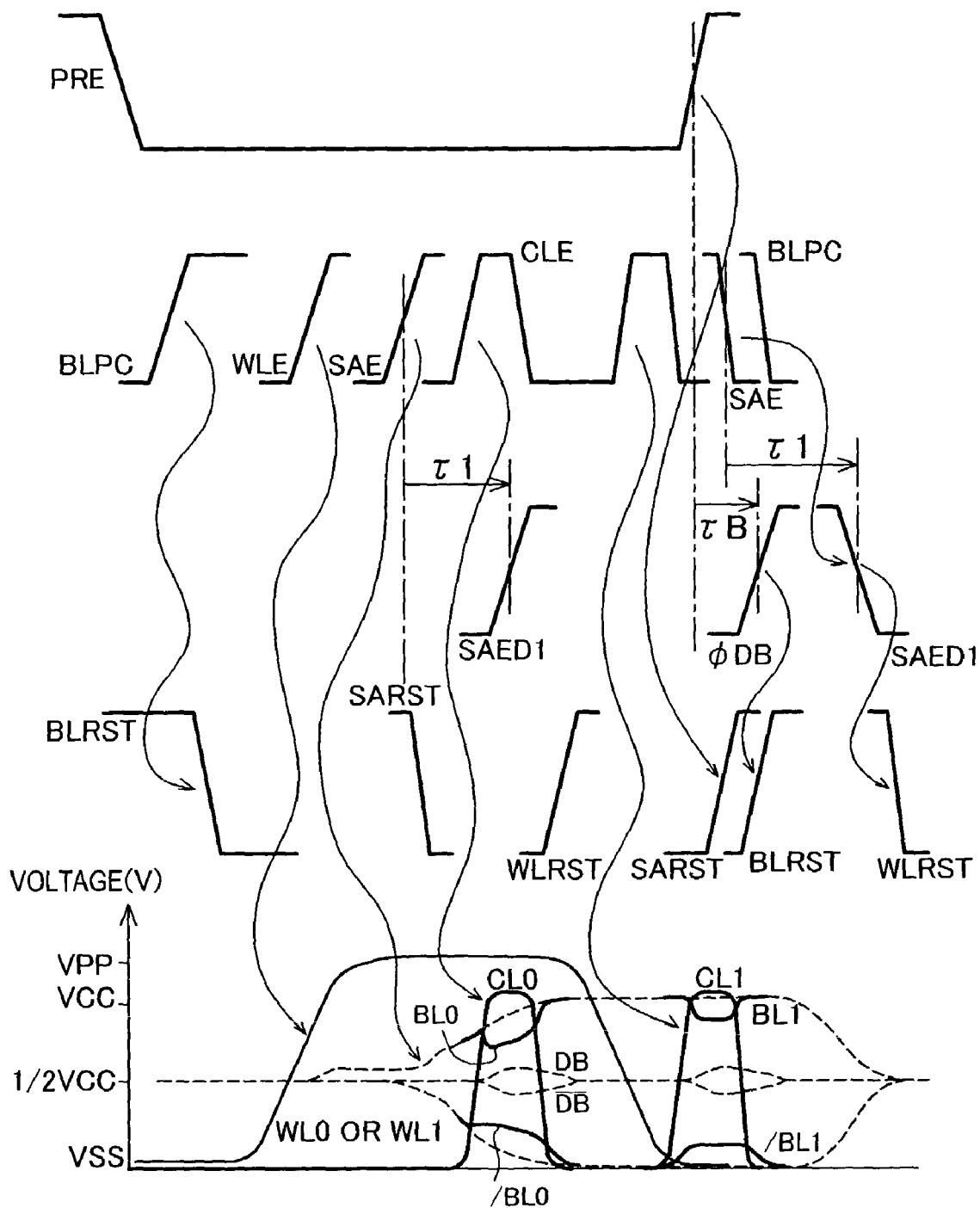
FIG. 4 shows an operational waveform diagram direct to the first embodiment.

FIG. 4 shows operational waveforms as to the First Embodiment (FIG. 2) and the specific example (FIG. 3) of its pre-charge control section 1. The pre-charge signal PRE makes transition to low level and the successive access operation is initiated. In the bit line equalizing circuit BLR1, the bit-line-equalizing cancel signal BLPC makes transition to high level and thereby, the bit line equalizing signal BLRST set in high level to the bit-line-equalizing cancel signal BLPC in low level makes transition to low level so that the equalizing situation is canceled. Then, since the bit line equalizing signal BLRST is activated again during the pre-charge period, it is set to a preset situation, and it goes into a situation in which high level transition of the delay signal $\phi DB$ can be accepted. Thereafter, by a not-shown control circuit, the word line activating signal WLE makes transition to high level and the word line WL0 or WL1 is activated through the word decoder WD. In addition, at this time point, the word line deactivating signal WLRST is in low level.

When the word line WL0 or WL1 is activated, stored charges to which the memory cells are connected and which are stored in the memory cells are distributed to the bit lines BL0 and BL1. Thereafter, by the not-shown control circuit, the sense amplifier activating signal SAE makes transition to high level and the sense amplifiers are activated so that differential amplification of the bit line pairs (BL0 and /BL0, BL1 and /BL1) is initiated. At the same time, the sense amplifier deactivating circuit SAR1 has the sense amplifier deactivating signal SARST make transition to low level so that the deactivating situation of the sense amplifiers is canceled. Then, since the sense amplifier deactivating signal SARST is activated again during the pre-charge period, it is set to the preset situation and goes into a situation in which high level transition of the pre-charge signal PRE can be accepted.

At timing that the differential amplification level is amplified up to a predetermined voltage level, a pulse signal in high level is outputted as an initial column-selection trigger signal CLE. Based upon the decoded column address, the column selecting line CL0 is driven as the pulse signal in high level, from the column decoder 0 (CD0) and the bit line pair (BL0 and /BL0) is connected to the data line pair (DB0 and /DB0). During this, voltage level of the bit line pair (BL0 and /BL0) is decreased due to the disturb phenomenon.

Thereafter, by the delay signal SAED1 outputted after the delay time $\tau 1$ from the high level transition of the sense amplifier activating signal SAE, the word line deactivating signal WLRST makes high level transition and deactivation of the word line WL0 or WL1 is carried out. The setting of the delay time $\tau 1$ is in principle carried out so that, after pulse driving of the initial column selecting line CL0 and after completion of differential amplification to the bit line pair, the word line deactivating signal WLRST makes high level transition. However, by the column-selection trigger signal CLE inputted to the inhibition (INH) terminal of the word line deactivating circuit WLR1, it is set so that it is not outputted during a period that the column-selection trigger signal CLE is inputted. Hereby, the high level transition of the word line deactivating signal WLRST is made to be outputted after the pulse driving of the column selecting line and it is possible to sufficiently secure the restore level to the memory cell at the time of deactivation of the word lines.

The word line deactivating signal WLRST is inputted to one of input terminals of the NAND gates through the enable (EN) terminals of the sense amplifier deactivating circuit SAR1 and the bit line equalizing circuit BLR1. Therefor, by the high level change of the word line deactivating signal WLRST, it goes into a situation in which it is inputted to the other input terminals of the NAND gates of the both circuits SAR1 and BLR1, and the pre-charge signal PRE and the delay signal φDB can be accepted.

In case that, after the access operation to the bit line pair (BL1 and /BL1) by the pulse driving of the column selecting line CL1, the pre-charge period is started and the pre-charge signal PRE makes high level transition, the sense amplifier deactivating signal SARST is outputted from the sense amplifier deactivating circuit SAR1. At this time point, the sense amplifier activating signal SAE in high level situation sets one of input terminals of the NOR gate of the sense amplifier deactivating circuit SAR1 through the inverter gate to low level. Therefore, by the high level transition of the other input terminal of the NOR gate due to the high level transition of the pre-charge signal PRE, the sense amplifier deactivating signal SARST makes high level transition. That is, due to the high level transition of the pre-charge signal PRE by the initiation of the pre-charge period, the sense amplifiers are deactivated.

Since the bit line equalizing circuit BLR1 has the same circuit structure as the sense amplifier deactivating circuit SAR1, by the high level transition of the delay signal φDB, the bit line equalizing signal BLRST makes high level transition so that the equalizing operation of the bit line pair is initiated. Here, the delay signal φDB for initiating the equalizing operation of the bit line pair is of a delay signal to which delay of the delay time τB is added from the pre-charge signal PRE through the delay circuit B (DB). Accordingly, the initiation of the bit line equalizing operation (the high level transition of BLRST) is delayed by the delay time τB to the initiation of the deactivation of the sense amplifier (the high level transition of SARST). In case that this delay time τB is set to be a predetermined time for deactivation of the sense amplifier, the equalizing operation of the bit line pair is to be carried out following the completion of the deactivation of the sense amplifier.

In addition, in the pre-charge period, the low level transition of the sense amplifier activating signal SAE is carried out. By the low level transition of the sense amplifier activating signal SAE, after the delay time τ1 through the delay circuit 1 (11), the delay signal SAED1 is changed to low level. Hereby, the word line deactivating signal WLRST make low level transition in preparation of a next access operation.

Figure 5:
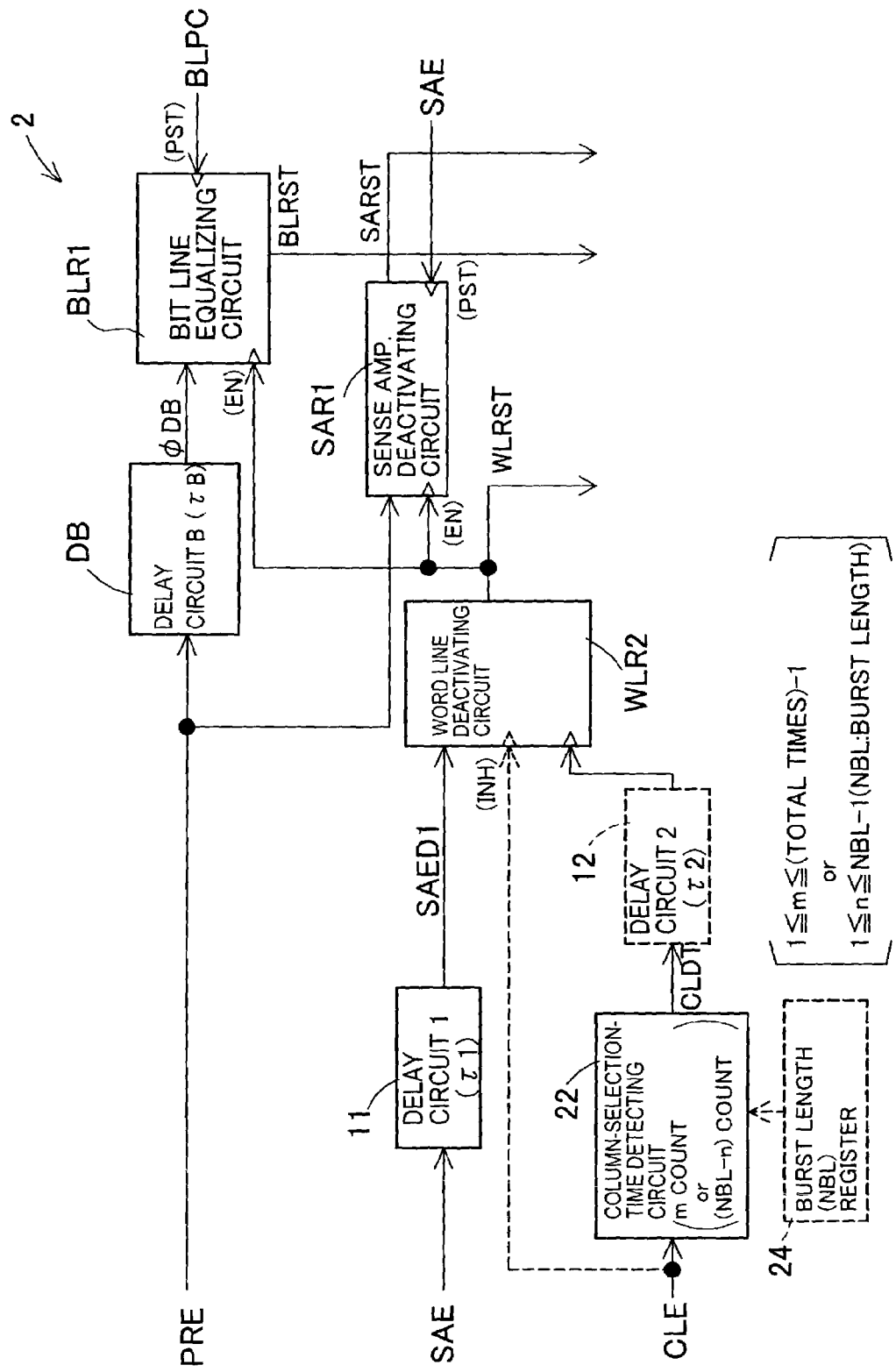
FIG. 5 shows a circuit block diagram of a pre-charge control section directed to a second embodiment.

In the pre-charge control section 2 of a Second Embodiment shown in FIG. 5, it is structured that, in place of the word line deactivating circuit WLR1 in the pre-charge control section 1 (FIG. 2) of the First Embodiment, a word line deactivating circuit WLR2 is provided and further, a column-selection-time detecting circuit 22 is provided. The column-selection-time detecting circuit 22 outputs a detection signal CLDT in case that the column-selection trigger signal CLE to be inputted reaches a predetermined number of times.

In addition, it is possible to set in such manner that the detection signal CLDT is supplied to the word line deactivating circuit WLR2 through a delay circuit 2 (12) that times delay time τ2. At this time, it is possible to make a structure that the delay circuit 1 (11) is deleted and the control from the sense amplifier activating signal SAE is eliminated. In case that at least any one of the delay circuits 11 and 12 is provided, or in response to the detection signal CLDT without having the delay circuit 2 (12), it is possible to time the predetermined timing between column selections, after the completion of the differential amplification in the bit line pair. Further, according to the delay time τ2, it is possible to time appropriate timing up to before a final column selection trigger signal CLE is outputted, to the detection signal CLDT outputted in case that the predetermined number of the column-selection trigger signal CLE is detected.

Further, the number of column selection which is detected by the column-selection-time detecting circuit 22 can be set to be 1 or larger, up to the number of times that 1 is subtracted from the number of all selection times, or, for burst length NBL, 1 or larger, up to the number of times of (NBL−1) or smaller. The former is the setting for the page mode in which, in response to the transition of the column address, the address access is carried out and the corresponding column selecting line is selected sequentially, and the latter is the setting for the burst mode in which, based upon the initial column address, the column selecting line is sequentially and automatically selected.

Here, in case that a burst length (NBL) register 24 is provided for the burst mode in response to the content of the burst length (NBL) register 24, it is possible to set maximum countable number (NBL−1) in the column-selection-time detecting circuit 22.

For the page mode, in case that maximum successive access number is set in advance based on an operational specification etc., the maximum countable number in the column-selection-time detecting circuit 22 can be set. Further, in case that the successive access number is uncertain, it is possible to correspond thereto by setting that the initial column selection is detected in the column-selection-time detecting circuit 22.

In case of the burst mode, it is preferable to make a structure that the delay time τ2 is set to be of time from the detected column-selection trigger signal CLE until initiation of an adjacent column-selection trigger signal CLE and (NBL−1)th column selection that is the maximum countable value in the column-selection-time detecting circuit 22 is detected. By this setting, before the initiation of (NBL)th column selection that is a final column selection, the word line deactivating signal WLRST is outputted.

On the occasion of carrying out write operation in this setting, at the time of (NBL)th column selection, write operation to the memory cell can not be carried out. In this case, corresponding column address and write data are stored in a register for temporary storage, and it is possible to correspond by imbedding as additional write operation, in a time region for refresh operation after the completion of the successive access operation. Here, the refresh operation is carried out in response to refresh specification in the above time region. However, since refresh cycle is of long cycle in general, a time region in which the refresh operation is carried out in fact is a part of the time regions secured for the refresh operation, and the remaining time regions are remained as vacant time regions with no access operation and no refresh operation. By imbedding the additional write operation in this vacant time regions, the deactivation of the word line is carried out in advance also as to the burst mode of the write operation so that the pre-charge period can be shortened.

In case that the write operation is carried out in the page mode, since the number of successive accesses is uncertain, the number of column selecting lines which are selected after the deactivation of the word line is made to be uncertain. In the page mode, when the word line is activated in one time of the successive access operation, total number (N) of the bit line pairs deferentially amplified is determined in advance and this total number (N) is the total number of column selection lines that are selected. Accordingly, to the write operation after the word line is deactivated in advance, it is structured that (N−1) sets of the temporary storage registers are provided and in the same manner as in the case of the burst mode, the additional write operation can be carried out in the time region for refresh operation after the completion of the successive access operation.

Figure 6:
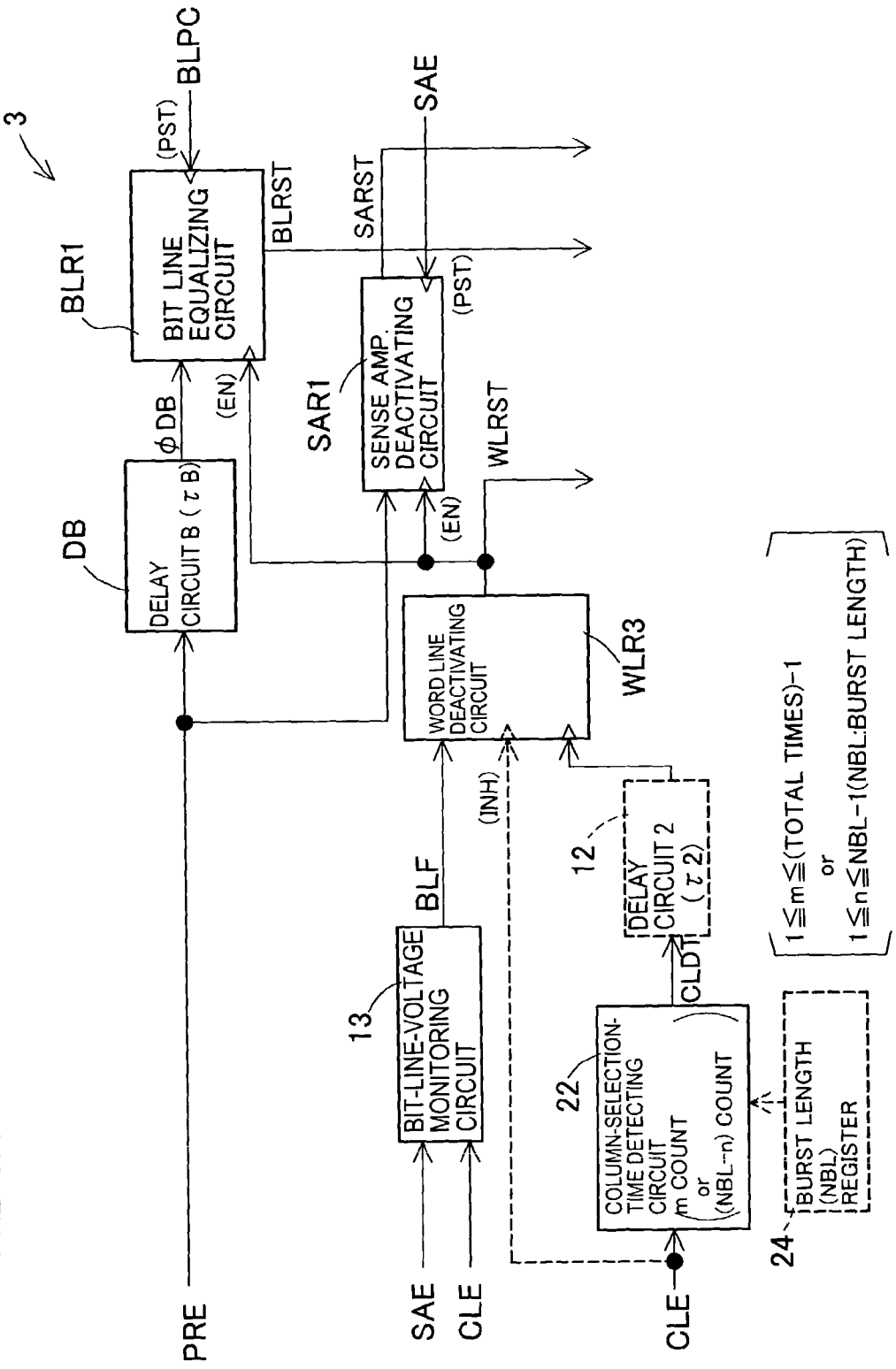
FIG. 6 shows a circuit block diagram of a pre-charge control section directed to a third embodiment.

In a pre-charge control section 3 of a Third Embodiment shown in FIG. 6, there is a structure that, in place of the word line deactivating circuit WLR2 in the pre-charge control section 2 (FIG. 5) of the Second Embodiment, a word line deactivating circuit WLR3 is provided. Further, in place of the delay circuit 1 (11) of the First and Second Embodiments (FIGS. 2 and 5), a bit-line-voltage monitoring circuit 13 is provided.

To the bit-line-voltage monitoring circuit 13, the sense amplifier activating signal SAE and the column-selection trigger signal CLE are inputted, and as a result of monitoring the bit line voltage, the detection signal BLF is outputted to the word line deactivating circuit WLR3.

Figure 7:
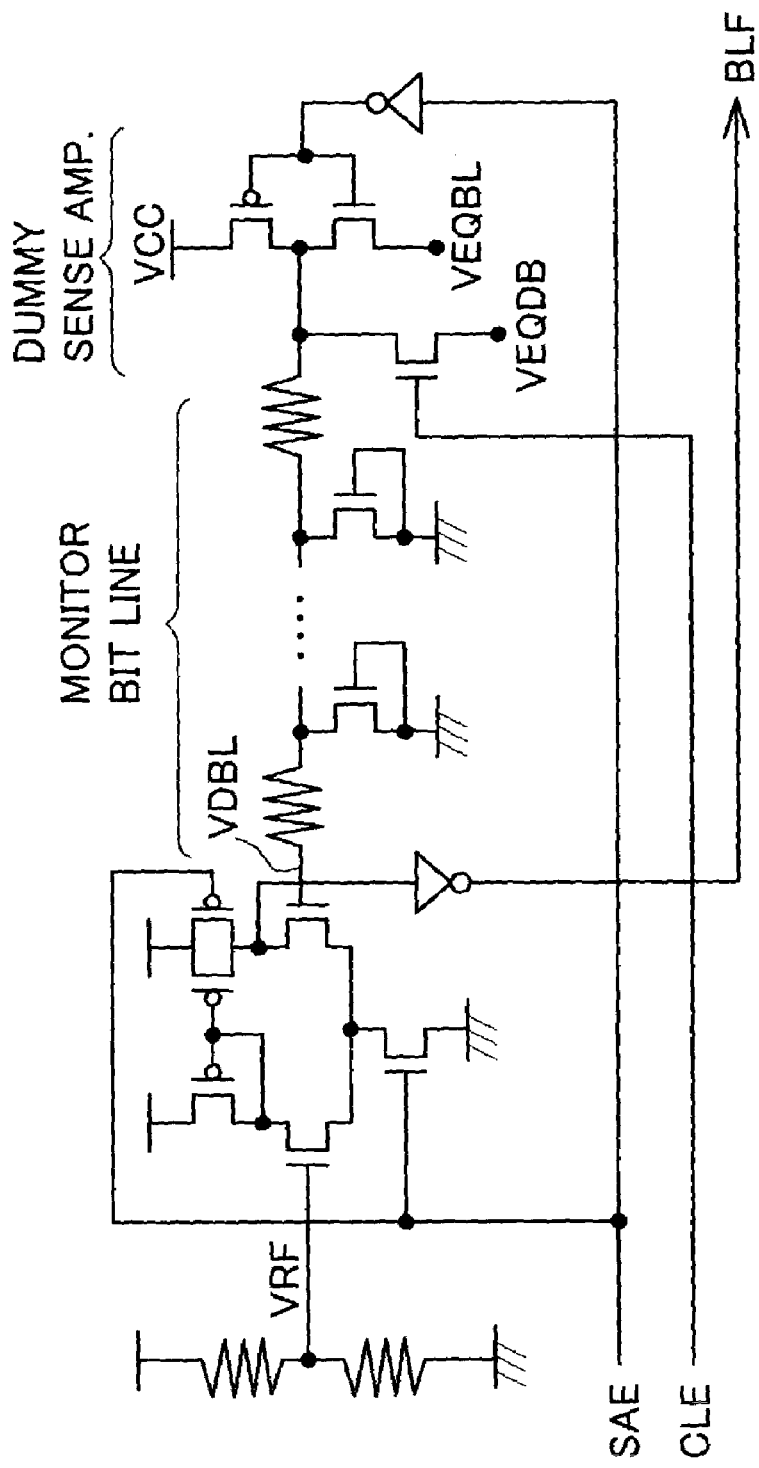
FIG. 7 shows a circuit diagram of a bit-line-voltage monitoring circuit directed to the third embodiment.

FIG. 7 shows a concrete example of the bit-line-voltage monitoring circuit 13. A comparator in which a bias current flows in response to the sense amplifier activating signal SAE of high level is provided, and to one of input terminals thereof, reference voltage VRF which is divided by registers is connected. To the other input terminal, one end of a monitor bit line is connected so that the bit line voltage VDBL is detected.

The monitor bit line has an equivalent physical structure to the real bit line and has an equivalent load structure. As a load that simulates a plurality of memory cells connected to the real bit line, a NMOS transistor which is equivalent to a NMOS transistor for switching which configures the memory cell is connected to in addition to connecting layout in the real bit line. Since this NMOS transistors simulate load in the real bit line, a gate terminal is connected to a source terminal and biased to ground voltage so that an off situation is maintained. The resistor component between connecting nodes of the NMOS transistors is of one which wiring resistor of the monitor bit line is explicitly described. Since it has the equivalent physical structure to the real bit line, it has an equivalent resistor value.

A dummy sense amplifier provided at the other end of the monitor bit line is of a circuit structure that simulates differential amplification of the real bit line by the sense amplifier. A connection is carried out from the monitor bit line to power source voltage VCC through a PMOS transistor and to equalizing voltage VEQBL of the bit lines through the NMOS transistor. The PMOS/NMOS transistors that configure the dummy sense amplifier have an equivalent driving ability to transistors that configure the sense amplifier. The equalizing voltage VEQBL is, for example, (½) VCC voltage. To gate terminals of the PMOS/NMOS transistors, the sense amplifier activating signal SAE is inputted through the inverter gate. That is, in case that the sense amplifier activating signal SAE is in low level and it is in the deactivating situation, the NMOS transistor is turned on and the monitor bit line is initialized to the equalizing voltage VEQBL. When the sense amplifier activating signal SAE becomes high level and it goes in the activating situation, the PMOS transistor is turned on and the monitor bit line is charged up to the power voltage VCC. It simulates a high level side bit line pair among the bit line pairs differentially amplified.

Further, the NMOS transistor that is controlled by the column-selection trigger signal CLE, turned on during the high level pulse driving period, and electrically connects the monitor bit line to voltage VEQDB, simulates the disturb phenomenon to the bit line when the bit line is connected to the data line. The voltage VEQDB is of a voltage central value of the data line that is amplitude-limited and for example, (½) VCC voltage.

In case that the bit line voltage VDBL exceeds the reference voltage VRF, the output terminal of the comparator makes low level transition and is inverted by the inverter gate and high level detection signal BLF is outputted. The reference voltage VRF is set to be of a voltage by which the bit line pair is sufficiently differentially amplified, and re-write of sufficient restore voltage to the memory cells is possible.

Figure 9:
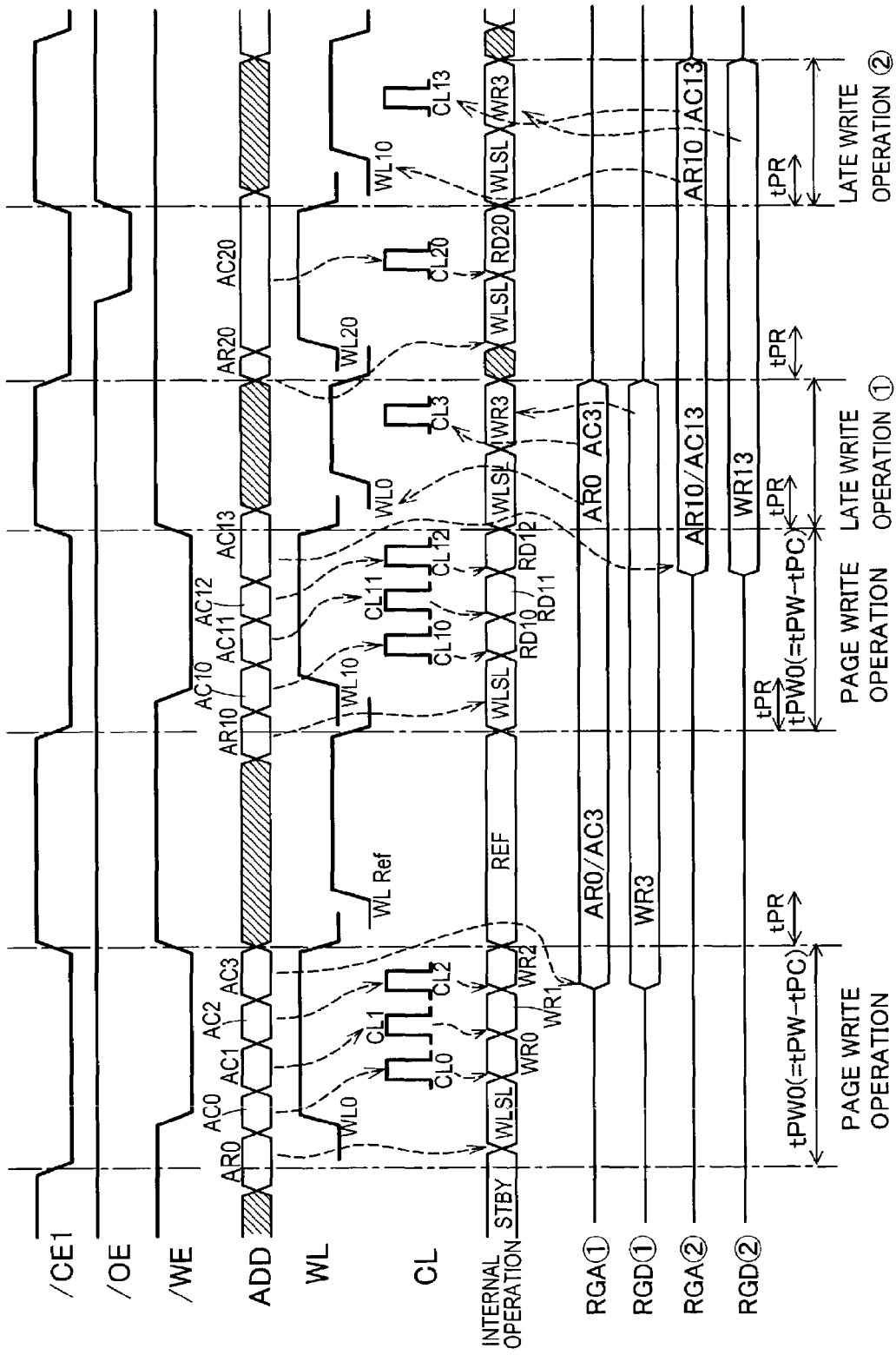
FIG. 9 is an operational waveform diagram showing late write function for page write operation of an asynchronous-type memory (fourth embodiment)

Operational waveforms of Fourth Embodiment shown in FIG. 9 show operational waveforms that are applied to the case (page write operation) in which a page operation of an asynchronous-type memory is a write operation. It is the case that has a so-called late write function in which the write operation after the word line is deactivated in advance is additionally written in a time region which is secured for refreshing.

Figure 8:
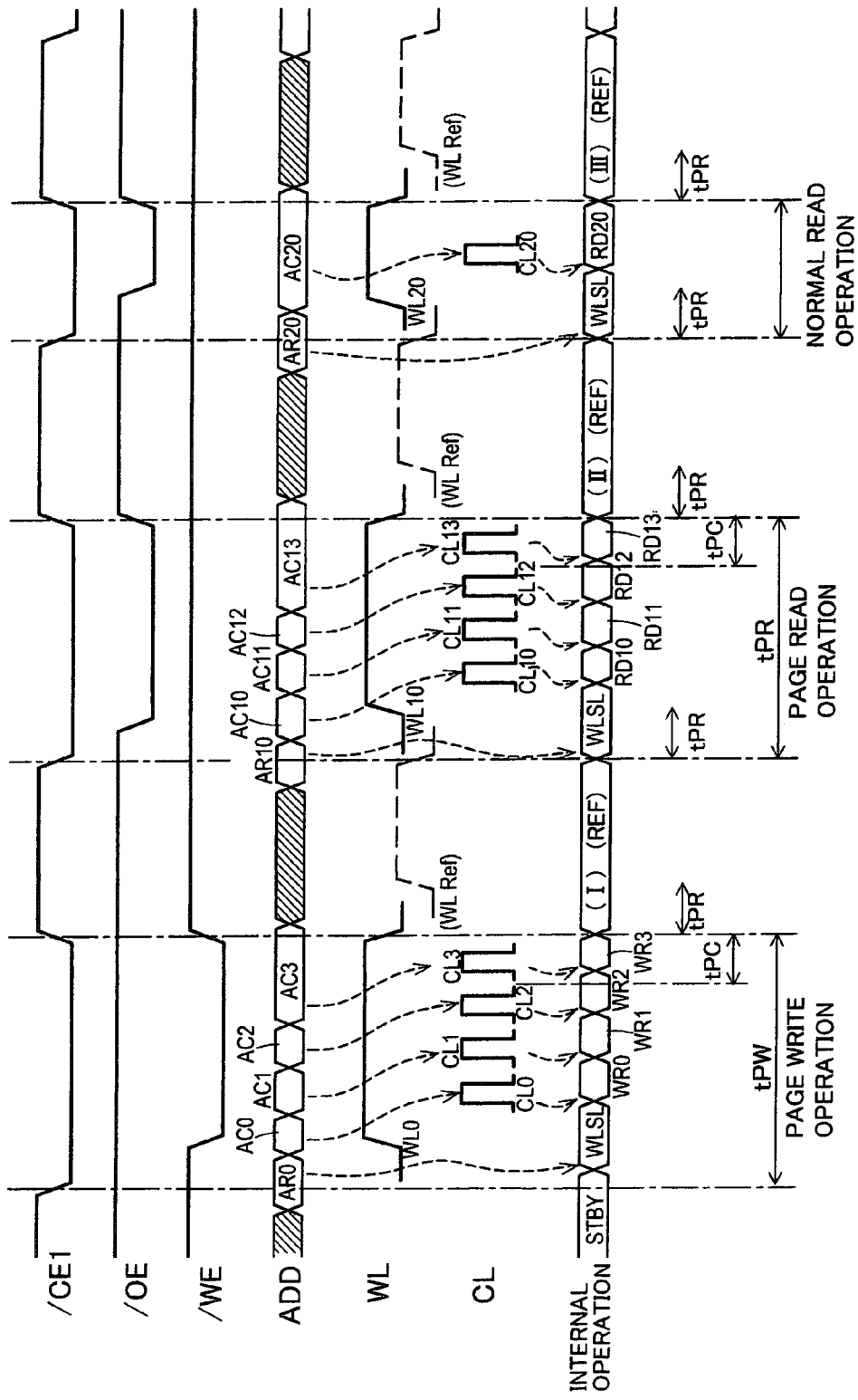
FIG. 8 is an operational waveform diagram showing page operation (normal operation) of an asynchronous-type memory.

In advance of description of Fourth Embodiment, operational waveforms including the page operation in a normal asynchronous-type memory are shown in FIG. 8. A first operation cycle is an operation cycle of the page write operation. The operation is initiated by low level change of /CE1 as a trigger and a row address AR0 is taken in as an address signal ADD and operation of row system is initiated. Concretely, the word line WL0 that is selected by decoding the row address AR0 is activated and data of the memory cells are read out to the bit lines and the differential amplification is carried out by the sense amplifiers (WLSL).

After the lapse of predetermined time, /WE is changed to low level and it is determined that this operation cycle is of the page write operation. At the same time, as the address signal ADD, column addresses AC0 through AC3 are sequentially switched to be inputted, together with write data (not shown). The switching of the column addresses AC0 through AC3 is controlled externally, and the column addresses are switched at appropriate operation cycle tPC so that the successive access operation (in this case, write operation) is carried out. The so-called address access operation is carried out. As for respective column addresses AC0 through AC3, corresponding column selecting lines CL0 through CL3 are activated by high level pulses, and the bit line pair which corresponds to each column address is connected to the data line pair so that write of data is carried out from outside (WR0 through WR3).

A second operation cycle is of the case that read-out operation is carried out as the page operation (page read operation). It is an equivalent operation to the page write operation. A word line WL10 which is selected by a row address AR10 is activated by low level change of /CE1 as a trigger (WLSL), and thereafter, based upon low level change of /OE, column selecting lines CL10 through CL13 which correspond to column addresses AC10 through AC13 are activated and successive data read-out is carried out (RD10 through RD13).

A third operation cycle is a normal read operation in which normal single bit read-out cycle is carried out. As for a word line WL20 that is selected by a row address AR20, a column selecting line CL20 which corresponds to a column address AC20 is activated and read-out of single bit data is carried out.

In the page operation of the asynchronous-type memory shown in FIG. 8, the number of successive accesses can be increased and decreased appropriately in response to the change of column addresses. In FIG. 8, a case in which the successive access operation is carried out for four column address changes is described as one example. It requires tPW as a cycle time of the page write operation and tPR as a cycle time of the page read operation.

There are secured time regions ((I) through (III)) for refreshing provided between any two of the three operation cycles, namely, first operation cycle, second operation cycle, and third operation cycle. However, it is general that a refresh cycle is of long cycle as compared with the normal operation cycle and for example, one refreshing operation is carried out for 1000 times of access operations that are carried out in several 10 nsec. Therefor, there is no case that the refreshing operation is carried out in all time regions between operation cycles. In case that it coincides with the refreshing cycle, it is carried out in any one time region among the time regions of ((I) through (III)), and a standby situation is maintained in other time regions. In case that the refreshing operation is carried out, normally, a word line WLRef which is different from before-and-after normal access operations is activated and therefore, it is necessary to set a pre-charge period tPR for switching the word line. During this period, switching of the word line, the deactivation operation of the sense amplifier based upon this and the equalizing operation of the bit line pair are carried out.

In Fourth Embodiment of FIG. 9, the first and second operation cycles are shown as the page write operation. In the above normal operation (FIG. 8), the word lines WL0 and WL10 are deactivated after selection of the column selecting lines CL3 and CL13 as to the fourth column addresses AC3 and AC13, and in contrast, in Fourth Embodiment, the deactivation is carried out after selection of the column selecting lines CL2 and CL12 by the third column addresses AC2 and AC12. Without carrying out the write operation to the fourth column addresses AC3 and AC13, it is possible to go into the pre-charge operation, and the cycle time tPW0 of the page write operation can be shortened with the operation cycle tPC of the successive access operation (tPW0=tRW−tPC).

As to the fourth column addresses AC3 and AC13 in which the write is not carried out in the operation cycle of the page write operation, column addresses AC3 and AC13 are stored in address registers RGA(1) and RGA(2), corresponding write data is stored in write data registers RGD(1) and RGD(2) and an additional write operation is carried out in the time region for refresh operation after the completion of the page write operation. In addition, in case of additional write, since it is general that word lines to be activated are different, it is preferable to store also row addresses which are activated in the page write operation in the address registers RGA(1) and RGA(2).

Here, it is preferable to have two sets of the address registers RGA(1) and RGA(2) and two sets of the write data registers RGD(1) and RGD(2). This is because, as shown in FIG. 9, two cycles of the page write cycle continue and the refreshing operation may be carried out in a time region between these periods. In this case, a column address and write data that are temporarily stored in an operation cycle of a first page write operation is additionally written in a time region after an operation cycle of a second page write operation. This is because it is necessary to keep a column address and write data which are temporarily stored in the operation cycle of the second page write operation until they are further additionally written in a time region after that, and at the same time, there exists a period for keeping two sets of objects to be additionally written in.

Further, in case that the word line is further deactivated in advance, at deactivation timing of the word line shown in FIG. 9, it is preferable that an address register and a write data register are provided in response to the number of column selecting lines which are selected after the deactivation of the word line. In this case, it is possible to apply the invention even to the page write operation in which the number of successive accesses is uncertain by appropriately providing a group of registers, in response to successive page write cycles, refreshing operation which is carried out between the periods, and further the number of additional write which is possible in one time region. For example, the number of column selecting lines which are selected after the deactivation of the word line is assumed to be 5. In case that the page write operation is carried out successively and the refreshing operation is carried out during the periods adjoining each other, it is possible to realize a late write function in case that 10 sets of registers for temporary storage are provided.

By further providing a register for temporary storage, or carrying out the additional write operation by the page operation and so on, it is possible to correspond to a case that the page write operation further continues.

In addition, in a semiconductor memory such as a pseudo-SRAM and so on in which an external access operation such as data read-out and write etc. and the refreshing operation are carried out independently, contemplated is a case in which an external-access-start request signal competes with a refresh-start request signal. In this case, there may be a case that cycle time tCE is defined by arranging the external access operation and the refreshing operation in one operation cycle as one series of operation. There may be a case that the refreshing operation is not actually carried out in a time region for refreshing operation at this time, and it is possible to carry out the additional write operation through the use of this time region.

By deactivating the word line in advance, the pre-charge period can be shortened and the cycle time of the page operation can be shortened. This advantage can be applied not only to the page read operation but also to the page write operation through the use of the above-described late write function.

Figure 11:
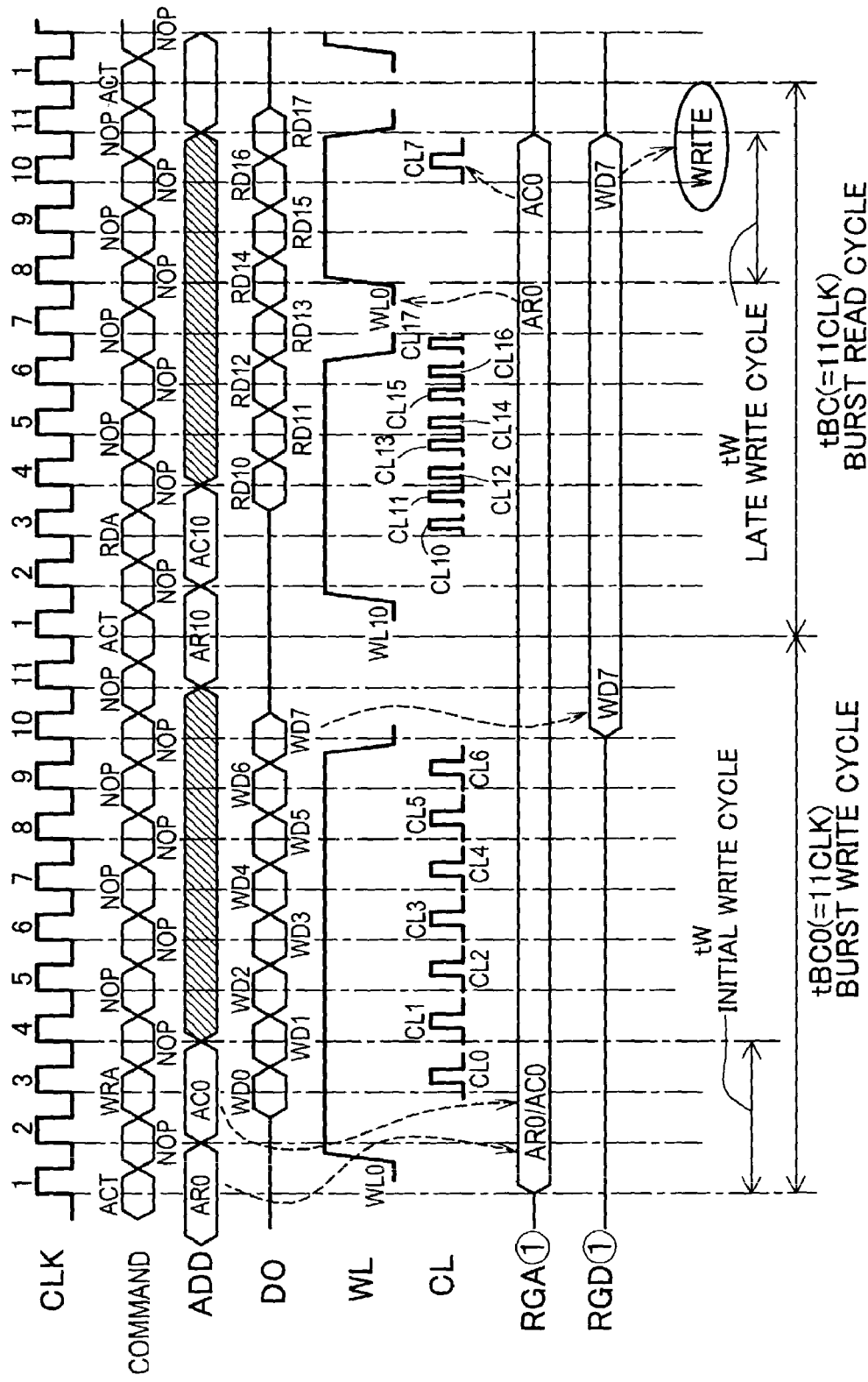
FIG. 11 is an operational waveform diagram showing late write function for burst write operation of a synchronous-type memory (fifth embodiment)
Figure 12:
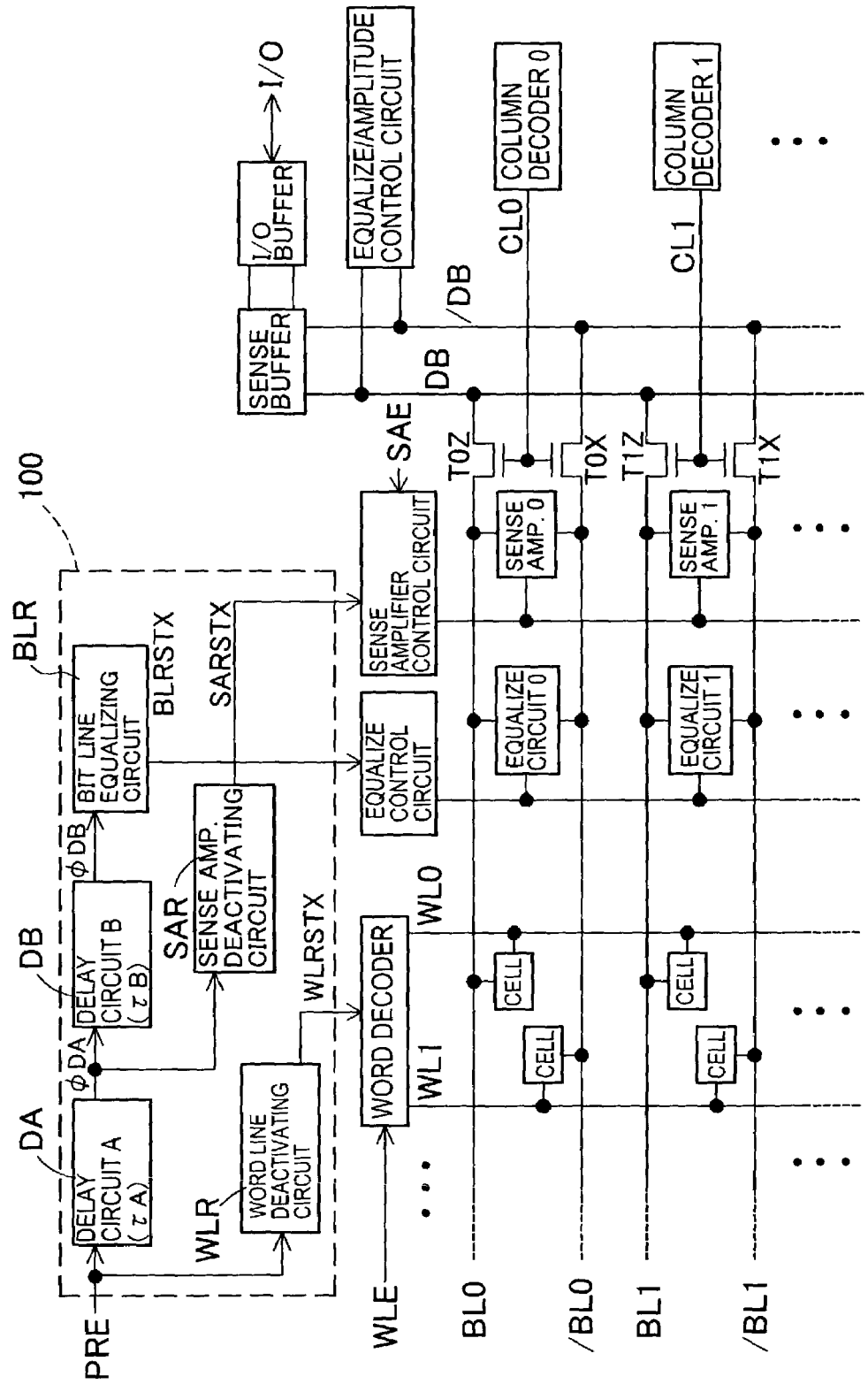
FIG. 12 is a circuit block diagram showing a data-input/output path of a semiconductor memory device directed to related art.
Figure 13:
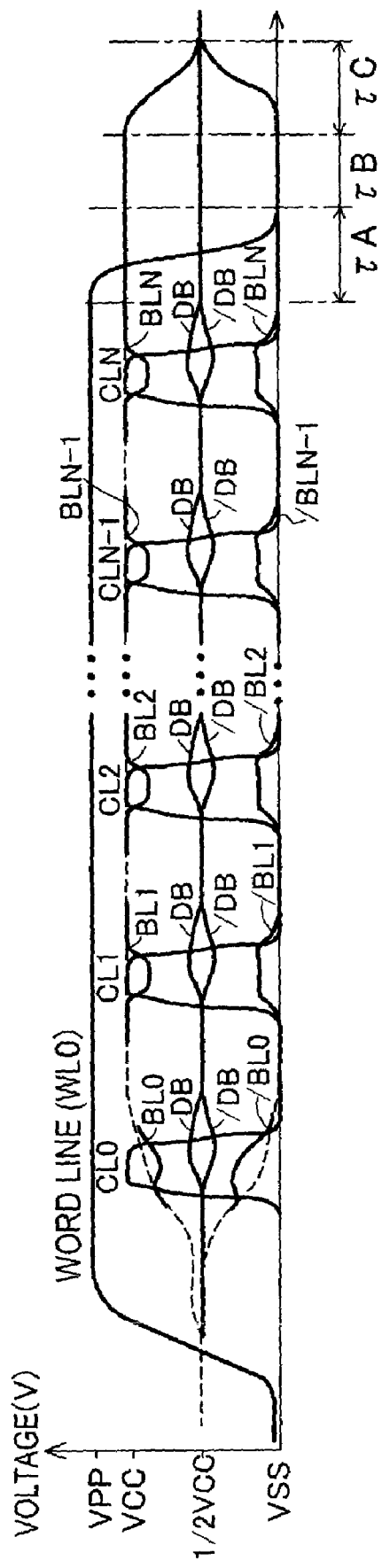
FIG. 13 is an operational waveform diagram showing successive access operation directed to the related art.

Operational wave forms of Fifth Embodiment shown in FIG. 11 shows operational wave forms that the invention is applied to a case (burst write operation) in which the burst operation of the asynchronous-type memory is the write operation. This is the case that has the so-called late write function in which the write operation after the word line is deactivated in advance is additionally carried out in a time region which is secured for refreshing.

Figure 10:
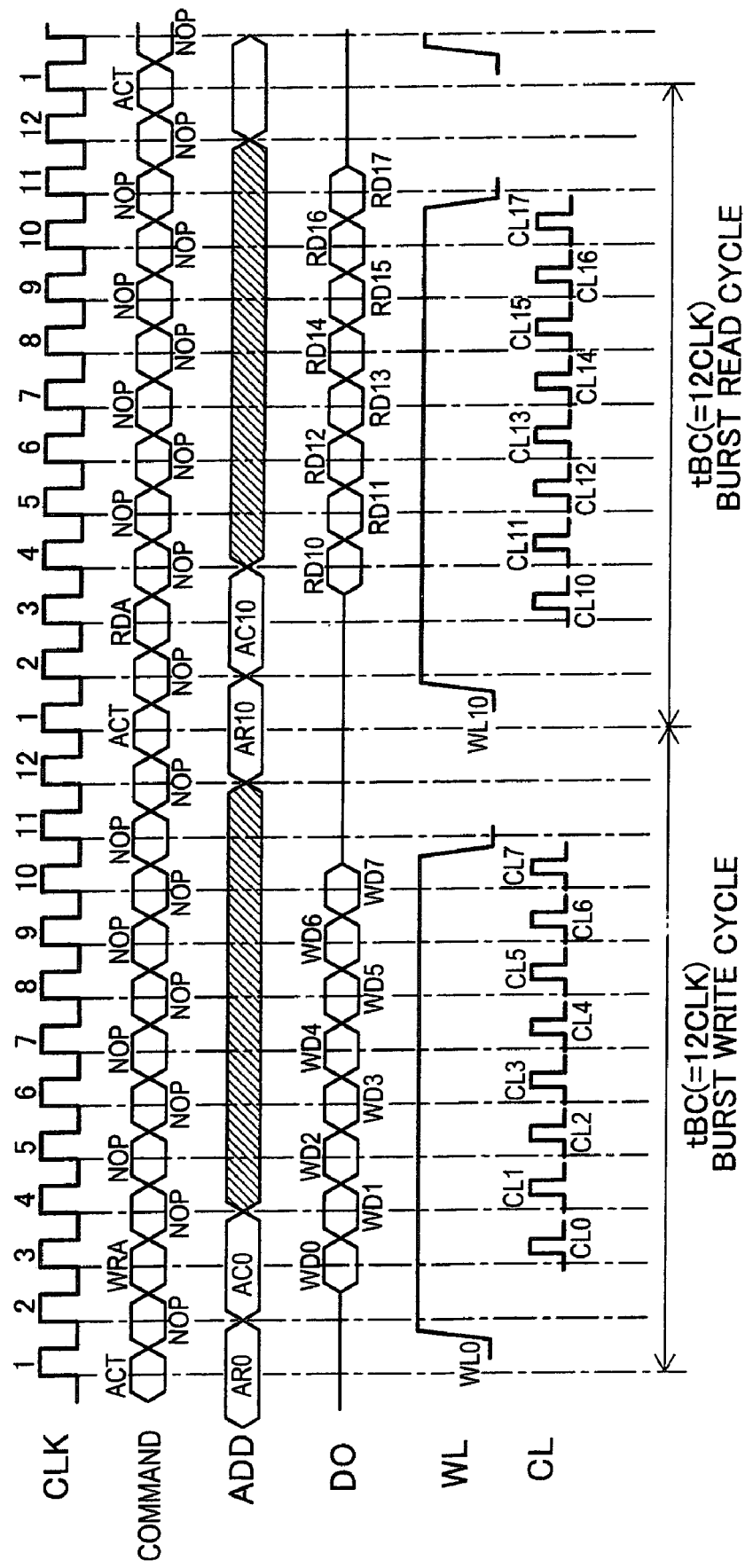
FIG. 10 is an operational waveform diagram showing burst operation (normal operation) of a synchronous-type memory.

In advance of description of Fifth Embodiment, burst wave forms in the normal synchronous-type memory are shown in FIG. 10. A first operation cycle is of a burst write operation and a second operation cycle is of a burst read operation. FIG. 10 is a timing chart of CAS latency 1. This is a case that as for the burst write operation and the burst read operation, the burst operation is carried out by commands (WRA command and RDA command) with an automatic pre-charge operation. This shows a case that burst length is 8.

By an active command ACT at clock 1, in response to row addresses AR0 and AR10, the word lines WL0 and WL10 are activated, and data which is read out to the bit line from the memory cell is differential-amplified by the sense amplifier. At clock 3, when WRA command and RDA command are inputted, based upon the column addresses AC0 and AC10 which are inputted at the same time, the burst write operation and the burst read operation are initiated, and input/output of data is carried out sequentially with respect to each clock. In the burst write operation, data WD0 through WD7 are written in at clock 3 through clock 10, and in the burst read operation, data RD0 through RD7 are read out at clock 4 through clock 11. A burst write cycle and burst read cycle are configured by 12 clocks (CLK), concurrently.

In Fifth Embodiment of FIG. 11, there are waveforms as to a synchronous-type semiconductor memory in which, by providing an operational specification for imbedding a time region for refreshing operation in the burst read operation, without discontinuing the burst operation, the refreshing operation can be carried out, and which has also the late write function. Conditions of the burst operation in FIG. 11 are, in the same manner as in the case of FIG. 10, of CAS latency 1, burst length 8 and burst operation by the command (WRA command and RDA command) with the automatic pre-charge operation.

In order to imbed the time region for refreshing in the burst read operation, column selecting lines CL10 through CL17 in the burst read operation are not synchronized with the clock CLK and hereby, selection is carried out at fast cycle. That is, in advance of timing of the clock CLK, the bit line pair and the data line pair are electrically connected and data is to be read out to the data line pair. It is specified that the data which was read out in advance is stored in a temporary storage circuit such as a data buffer circuit and so on and is to be outputted to outside in synchronous with the clock CLK which is read-out timing thereafter.

In order to read out data in advance, it is possible to equalize the bit line pairs that are differentially amplified for reading out the data at fast timing as compared with an external specification. Therefor, a time region is secured in last half of the page read cycle (clocks CLK7 through CLK 11), and it is possible to imbed the refreshing operation in this time region. Further, it is possible to also utilize this time region as an additional write area for the column selecting line CL7 to which write was not carried out in the burst write operation.

In addition, also in the burst read cycle, it is possible to shorten the pre-charge period by deactivating the word line WL10, between the column selecting lines CL16 and CL17 that correspond to RD16 and RD17 as read-out operations.

In the burst write operation, in the same manner as in the case of FIG. 10, the burst operation is carried out at timing that is synchronized with the clock. In order to deactivate the word line in advance, the burst write operation is completed without carrying out the write to the column selecting line CL7. The column address that is not written in and write data are kept in the address register RGA(1) for temporary storage and the write data register RGD(1). At this time, it is preferable to keep row address in the address register RGA(1). The address and write data which are kept in the registers RGA(1) and RGD(1) can be additionally written in the time region which is imbedded in the burst read operation.

By deactivating the word line in advance, it is possible to shorten the pre-charge period, and possible to shorten the cycle time of the burst operation. This advantage can be applied to not only the burst read operation but also to the burst write operation, by utilizing the above-described late write function.

Further, since the burst operation is carried out without carrying out the selection of the column selecting line CL7, the burst write cycle can be of 11 clocks in 1 clock shortened, whereas it is of 12 clocks in normal case. In the burst read cycle, since the column selecting lines CL10 through CL17 can be selected in advance of the clock CLK, the number of cycle clock can be reduced in the same manner. It is possible to realize the shortening of the burst operation.

As described above in detail, in the control method of the semiconductor memory device and, in the semiconductor memory device, it is possible to carry out the deactivation of the word lines WL0, WL1 and WL10 during the ongoing successive access operation such as the page operation, the burst operation and so on, and it is not necessary to carry out the same during the pre-charge period which is an initialization operation period after completion of the successive access operation. Based upon increase of capacity of the semiconductor memory device, the word lines WL0, WL1 and WL10 are connected to a plurality of memory cells and wiring length is lengthened, and even in case that time constant of voltage transition is increased on the occasion of the deactivation, time constant of the deactivation of the word lines WL0, WL1 and WL10 are not to be added during the pre-charge period and it is possible to shorten the pre-charge period. Accordingly, proportion of the pre-charge period to the access period for the memory cells can be compressed, and it is possible to shorten the cycle time and to improve an occupied ratio of the data access operation which is occupied in the operation period of the semiconductor memory device.

In addition, in case of the synchronous-type memory, the additional write cycle for executing the late write operation may be carried out during a clock suspend mode, a power down mode and so on, which are operation modes in which, without carrying out the external access operation, it is known in advance that NOP cycle of a given time continues.

Further, the deactivating operation of the word lines WL0, WL1 and WL10 is carried out in case that the word line activating circuits WLR1 through WLR3 are activated, in the successive access operation, in such a situation that the column-selection trigger circuit CLT which is the column selection section does not output the column-selection trigger signal CLE. Since the column selecting lines CL0 and CL1 from the column decoders 0, 1 (CD0 and CD1) are not selected, the deactivating operation of the word lines WL0, WL1 and WL10 can be carried out, by avoiding a period that a plurality of bit lines receive the disturb phenomenon during column selection, at a time point that, after completion of the column selection, restore to the plurality of memory cells is completed. It is possible to shorten the pre-charge period without aggravating retention of data that is stored in the plurality of memory cells.

Further, in an activated situation before deactivation of the word lines WL0, WL1 and WL10 is carried out, data access is initiated at a stage that bit lines BL0 and BL1 or /BL0 and /BL1 are amplified to a voltage level in which logical level of data is not reversed even in case of the disturb phenomenon. Accordingly, as an initial data access speed in the successive access operation is maintained in high speed, the deactivating operation of the word lines WL0, WL1 and WL10 is carried out during the successive access operation and thereby, it is possible to shorten the pre-charge period.

Furthermore, time from activation of the successive access operation until completion of differential amplification of data in a plurality of the bit line pairs is inherent time by a circuit structure of the semiconductor memory device, physical condition and so on, and further, period between the column-selection trigger signals CLE in the successive access operation is time that is defined in response to the time which is inherent to the semiconductor memory device or the operational specification thereof, and thereby, this time is timed as the delay time τ1 which is first predetermined delay time, or the delay time τ2 that is second predetermined delay time so that a predetermined timing after completion of differential amplification in the plurality of bit line pairs can be timed. Further, the delay time τ1 can be timed by the delay circuit 1 (11) that is a first delay circuit, and the delay time τ2 can be timed by the delay circuit 2 (12) that is a second delay circuit.

Here, the delay time τ2 is of one that times the predetermined time from completion of the anterior column-selection trigger signal CLE that is a first column selection until before initiation of the posterior column-selection trigger signal CLE that is a second column selection. It is possible that the precedent and following column-selection signals CLE are made to be adjacent trigger signals, and intermediate time during that period is timed.

In addition, as to the column-selection trigger signals CLE in the successive access operation, the case of the inherent time due to the circuit structure of the semiconductor memory device and the operational specification is, for example, the access operation in the burst mode, and the case of the time defined in response to the input/output specification is, for example, a case in which data access is carried out in response to change of column address inputted from outside and access commands.

Further, the word line activating signal WLE means a signal including, in addition to activating operation of the word lines WL0, WL1 and WL10 or its control signal, an operation relating to activation of the word lines WL0, WL1 and WL10 or its control signal, and a predetermined operation which is carried out at a predetermined timing to the activation of the word lines WL0, WL1 and WL10 or its control signal. Furthermore, the sense amplifier activating signal SAE which is a signal for initiating the differential amplification of data means a signal including, in addition to the activating operation of the sense amplifier or its control signal, an operation relating to the initiation of the differential amplification or its control signal, and a predetermined operation which is carried out at a predetermined timing to the initiation of the differential amplification or its control signal. As to an operation of row series, it is a signal including a series of operations that are carried out at a predetermined timing or its control signal.

Further, in case that, due to the circuit structure of the semiconductor memory device, the physical condition thereof or the operational specification and so on, at the time of completion of the precedent column-selection trigger signal CLE, the differential amplification of data is completed, it is not necessary to have the delay circuit 2 (12). It is possible to have the time point of completing the precedent column-selection trigger signal CLE the predetermined timing.

Furthermore, as to the semiconductor memory device which carries out the burst operation, it is possible to set appropriately the anterior column-selection trigger signal CLE out of trigger signals below (burst length−1)th time. Furthermore, it is possible to set to a trigger signal CLE of (burst length−1)th time which is a trigger signal CLE of one before a final column-selection trigger signal CLE. In this case, in a trigger signal CLE other than the final column-selection trigger signal CLE, the word lines WL0, WL1 and WL10 are in activated situation and it is possible to flexibly correspond also to the successive write operation.

Moreover, since a plurality of bit lines BL0 and BL1, or /BL0 and /BL1 are electrically connected to a plurality of memory cells C00 and C10 or C01 and C11, it is possible to deactivate the word line WL0 or WL1 at inherent minimum time which is determined by the circuit structure of the semiconductor memory device, the physical condition and so on, by deactivating the word line WL0 or WL1 at time point that data restoration to the plurality of memory cells C00 and C10 or C01 and C11 is completed. In advance of the successive access operation, the word line WL0 or WL1 can be deactivated, and in the page operation in which length of the successive access is not fixed, it is possible to shorten the pre-charge period regardless of the length of successive access.

Further, based upon the initial column-selection trigger signal CLE, it is possible to deactivate the word lines WL0, WL1 and WL10 at the inherent minimum time which is determined by the circuit structure of the semiconductor memory device, the physical condition and so on. In advance of continuous successive access operation, the word lines WL0, WL1 and WL10 can be deactivated, and in the page operation in which length of the successive access is not fixed, it is possible to shorten the pre-charge period regardless of the length of successive access.

Furthermore, according to Third Embodiment, it is possible to surely detect the completion of differential amplification, by detecting voltage level of the monitor bit line that has a structure equivalent to the bit line and has an equivalent load structure.

In addition, the invention is not limited to the above-described Embodiments, and it goes without saying that various improvements and modifications are possible within a scope that does not depart from the gist of the invention.

For example, in First through Third Embodiments, a predetermined combination as to the delay circuit 1 (11), the column-selection-time detecting circuit 22 and the bit-line-voltage monitoring circuit 13 was exemplified but in the invention, it is not limited to this combination and it is possible to configure by use of respective ones independently. Further, it is possible to use them in an appropriate combination other than the exemplified one.

Further, in Fourth and Fifth Embodiments, the page operation was described as the successive access operation of the asynchronous-type memory and the burst operation was described as the successive access operation of the synchronous-type memory, but it goes without saying that the invention can be applied to a case in which the burst operation function is applied to the asynchronous-type memory and a case in which the page operation is applied to the synchronous-type memory. Here, the burst operation to the asynchronous-type memory is of a case having an operation in which an internal counter and so on are provided, and based upon an input of an initial column address, an access point is switched sequentially. Further, the page operation to the synchronous-type memory is of a case in which the read command and the write command continue.

In the present invention, activation of a word line or word line activating signal includes activating operation of a word line or its control signal, correlative operations for activation of word lines or theirs control signals, and predetermined operation to be carried out for activation of a word line with predetermined timing or its control signal, respectively. Furthermore, initiation of data amplification or an initializing signal for data amplification includes initializing operation for amplifying circuit such as a sense amplifier or its control signal or the like, operation for starting data amplification or its control signal, and predetermined operation to be carried out for initializing data amplification with predetermined timing or its control signal, respectively. Operation for row system includes sequential operations carried out with predetermined timing or its control signal.

Furthermore, selection of first column selection or the first column selecting section may be set to (burst length −1)th column selection that is precedent to last column selection in successive access operation so that column selections other than the last column selection can be put on active state. This is preferable for write operation.

Furthermore, based on the first column selection or selection by the first column selecting section set as the first column selection in successive access operation, there may be carried out deactivation of a word line with the shortest time that is inherent to circuit structure or materiality condition of a semiconductor memory device. Thereby, the word line can be deactivated prior to ongoing successive access operation and pre-charge period can be shortened regardless of successive access length during page mode where length of successive access operation is uncertain.

Furthermore, in case successive access operation is successive data write operation, as for write operation to column selection after deactivation of a word line, it is preferable that address and write data are temporarily stored. A period of successive data write operation is shorter than a refresh period, therefore, out of time region secured for refresh operation, a part of the time region where refresh operation is not carried out can be utilized for additional data write operation.

In this case, as for a temporary storing region or address register group and a write-data register group, it may be structured such that column address corresponding to memory cell groups as many as a number obtained by subtracting 1 from the number of memory cells selected by a word line to be activated can be stored. Thereby, even if a word line is deactivated with any timing, a column address group and a write data group corresponding to following write operation can be stored temporarily. In page mode for data write operation where length of successive access operation is not determined, a word line can be deactivated with proper timing regardless of length of successive access. Furthermore, as for burst mode for write operation where length of successive access is determined, a word line can be deactivated with proper timing.

Furthermore, additional write operation may be carried out successively so that additional write operation can be carried out with high-speed.

According to the invention, at the predetermined timing during the column selection in the successive access operation, deactivation of the word line which was carried out during the pre-charge period is carried out in advance, and thereby, without any deterioration of the restore voltage to the memory cell and any delay of an initial data access time, it is possible to shorten the pre-charge period after the successive access operation.

What is claimed is:

1. A control method of a semiconductor memory device for executing successive access operation, the control method comprising steps of:
    amplifying data of a plurality of memory cells connected to a plurality of bit lines by activating a word line;
    connecting by column selections at least one bit line out of the plurality of the bit lines and at least one data line in order after the step of amplifying data;
    deactivating the word line in a period that satisfies following two conditions (1) and (2): (1) a period after predetermined timing taken after the data amplification at the plurality of bit lines completes; and (2) non-column selection period between completion of an anterior first column selection and start of a posterior second column selection.

2. A control method of a semiconductor memory device according to claim 1, wherein the predetermined timing is timed based on either first predetermined delay time that starts with activation of the successive access operation or second predetermined delay time that starts with termination of the first column selection.

3. A control method of a semiconductor memory device according to claim 2, wherein activation of the successive access operation corresponds to activation of the word line or start of the data amplification.

4. A control method of a semiconductor memory device according to claim 2, wherein, in case the first column selection terminates after completion of the data amplification, the predetermined timing corresponds to time that the first column selection terminates.

5. A control method of a semiconductor memory device according to claim 1, wherein there is burst mode in which column selections based on initial column address are automatically conducted in order, and under the burst mode, the first column selection is column selection of Nth time where N is a number same as or smaller than (burst length −1).

6. A control method of a semiconductor memory device according to claim 5, wherein the first column selection is column selection of Nth time where N is a number same as (burst length −1).

7. A control method of a semiconductor memory device according to claim 1, wherein there is page mode in which column selection corresponding to each column-address transition is conducted in order, and under the page mode, the predetermined timing corresponds to timing that the data amplification is completed.

8. A control method of a semiconductor memory device according to claim 1, wherein there is a page mode in which column selection corresponding to each column-address transition is conducted in order, and under the page mode, the first column selection is column selection to be firstly conducted among the successive access operation.

9. A control method of a semiconductor memory device according to claim 1, wherein the predetermined timing is determined based on voltage level detection at the plurality of the bit lines or voltage level detection at a monitor bit line having load structure equivalent to that of the plurality of the bit lines.

10. A control method of a semiconductor memory device according to claim 1,
    wherein, in case the successive access operation corresponds to successive data-write operation,
    out of column address group, at least one column address corresponding to at least one column selection conducted after deactivation of the word line, and out of write data groups, at least one write data are fetched to a temporary store region, and after completion of the successive data-write operation, out of time region secured for refresh operation, a part of the time region where refresh operation is not conducted is provided so that additional data-write operation is made from the temporary store region to at least one of the memory cells.

11. A control method of a semiconductor memory device according to claim 10, wherein the additional data-write operation is successive access operation for selecting column address from the column address group in order.

12. A control method of a semiconductor memory device according to claim 10, wherein there are provided at least two sets of the column addresses and at least two sets of write data in the temporary store region.

13. A control method of a semiconductor device comprising the steps of:

activating a word line in accordance with start request of successive access operation so as to connect a plurality of memory cells to a plurality of bit lines, respectively;

amplifying a plurality of data read out to the plurality of bit lines from the plurality of memory cells;

starting the successive access operation by conducting column selection in order for connecting at least any one of the plurality of bit lines to at least one data line after amplification level in the step of amplifying a plurality of data reaches predetermined level;

deactivating the word line after the amplification operation in the step of amplifying a plurality of data is completed and while the column selection in the step of starting the successive access operation is deactivated keeping the successive access operation after the step of deactivating the word line; and initializing the plurality of bit lines by stopping data amplification operation in accordance with termination request of the successive access operation.

14. A control method of a semiconductor memory device according to claim 13, wherein in case the successive access operation is successive data-write operation, the control method further comprises:

temporary-data-store step where out of column address group, at least one column address to which data-write request is generated in the data-access-keep step and out of write-data group, at least one write-data to be written on at least one column address in the column address groups are temporarily stored; and additional-data-write step where the write-data group are written on the memory cells corresponding to the column address group temporarily stored in time region for refresh operation where refresh operation is not conducted after termination of the successive access operation.

15. A semiconductor memory device comprising:

a plurality of bit lines each of which is connected to each of a plurality of memory cells when a word line is activated;

a plurality of column selecting sections where each of the plurality of bit lines is individually selected; and at least one data line to be connected to at least any one of the plurality of bit lines through at least any one of the plurality of column selecting sections;

the semiconductor memory device conducting successive access operation by selecting at least any one of the plurality of column selecting sections in order, wherein the semiconductor memory device further comprises:

a first-column-selection-termination detector circuit that detects termination of selecting a first column selecting section to be selected in advance;

a timing informer section that informs a period that is after completion of data amplification and from termination of selecting the first column selecting section to be selected in advance until start of selecting a second column selecting section to be selected after selection of the first column selecting section; and a word line deactivating circuit that becomes active when none of the plurality of column selecting sections operates is selected in accordance with an informing signal from the timing informer section.

16. A semiconductor memory device according to claim 15, wherein the timing informer section includes at least one of following two circuits, namely, a first delay circuit to which an activating signal for activating the successive access operation or its synchronous signal is inputted, or a second delay circuit to which a detection signal from the first-column-selection-termination detector circuit is inputted.

17. A semiconductor memory device according to claim 16, wherein the activating signal for activating the successive access operation is either an activating signal for activating the word line or a start signal for starting the data amplification.

18. A semiconductor memory device according to claim 16, wherein in case the detection signal is outputted after completion of the data amplification, the detection signal from the first-column-selection-termination detector circuit is defined as an informing signal generated at the timing informer section.

19. A semiconductor memory device according to claim 15, wherein the semiconductor memory device is equipped with burst mode in which one of the column selecting sections is selected in order posterior to selection of an initial column selecting section in accordance with initial column address, and the first-column-selection-termination detector circuit regards a column selecting section selected within N selection times where N is a number same as or smaller than (burst length −1), as the first column selecting section.

20. A semiconductor memory device according to claim 19, wherein the first column selecting section is a column selecting section selected at Nth selection time where N is a number same as (burst length −1).

21. A semiconductor memory device according to claim 15, wherein the semiconductor memory device is equipped with page mode in which each of the column selecting sections corresponding to each of column address in order, and the timing informer section informs termination of the data amplification.

22. A semiconductor memory device according to claim 15, wherein the semiconductor memory device is equipped with page mode in which each of the column selecting sections corresponding to each of column address in order, and the first-column-selection-termination detector circuit regards a column selecting section firstly selected in the successive access operation, as the first column selecting section.

23. A semiconductor memory device according to claim 15, wherein the timing informer section includes a bit-line-voltage monitoring section that detects voltage level of the plurality of bit lines or voltage level of a monitor bit line having load structure equivalent to the plurality of the bit lines.

24. A semiconductor memory device according to claim 15 wherein, in case the successive access operation corresponds to successive data-write operation, the semiconductor memory device further comprises address register group that store, out of column address group, at least one column address corresponding to selection request of at least one of the column selecting sections after deactivation of the word line, and write-data register group of at least one write-data, and within a time region secured for refresh operation after termination of the successive data-write operation, additional data-write operation is conducted for the memory cells by selecting corresponding column address and write-data from the address register group and the write-data register group.

25. A semiconductor memory device according to claim 24, wherein the address register group and the write-data register group are provided with at least two sets of the column addresses and at least two sets of write data, respectively.

* * * * *